(12) United States Patent
Stitt et al.

(10) Patent No.: US 11,269,044 B2
(45) Date of Patent: Mar. 8, 2022

(54) SYSTEM AND METHOD FOR DETERMINING ANGLE OF ARRIVAL FOR COMMUNICATIONS

(71) Applicants: DENSO International America, Inc., Southfield, MI (US); DENSO CORPORATION, Kariya (JP)

(72) Inventors: R. Michael Stitt, Ada, MI (US); Warren Guthrie, West Olive, MI (US)

(73) Assignees: DENSO International America, Inc., Southfield, MI (US); DENSO CORPORATION, Kariya (JP)

( * ) Notice: Subject to any disclaimer, the term of this patent is extended or adjusted under 35 U.S.C. 154(b) by 107 days.

(21) Appl. No.: 16/795,855

(22) Filed: Feb. 20, 2020

(65) Prior Publication Data

US 2020/0264257 A1  Aug. 20, 2020

Related U.S. Application Data

(60) Provisional application No. 62/807,858, filed on Feb. 20, 2019, provisional application No. 62/807,857, filed on Feb. 20, 2019.

(51) Int. Cl.

| *G01S 3/48* | (2006.01) |
|---|---|
| *G01S 3/50* | (2006.01) |
| *H04L 12/801* | (2013.01) |
| *G01S 3/04* | (2006.01) |
| *G01S 3/02* | (2006.01) |
| *G01S 3/46* | (2006.01) |
| *G01S 3/64* | (2006.01) |

(Continued)

(52) U.S. Cl.
CPC ............... *G01S 3/48* (2013.01); *G01S 3/023* (2013.01); *G01S 3/04* (2013.01); *G01S 3/043* (2013.01); *G01S 3/465* (2013.01); *G01S 3/50* (2013.01); *G01S 3/64* (2013.01); *H03D 7/168* (2013.01); *H04L 47/115* (2013.01)

(58) Field of Classification Search
CPC . G01S 3/48; G01S 3/043; G01S 3/465; G01S 3/64
USPC .......................................... 342/147; 702/159
See application file for complete search history.

(56) References Cited

U.S. PATENT DOCUMENTS

2010/0076722 A1* 3/2010 Ohara ................... H04B 17/27
                                                              702/159

FOREIGN PATENT DOCUMENTS

| EP | 1 381 173 | 1/2004 |
|---|---|---|
| JP | 2001-285162 | 10/2001 |

(Continued)

OTHER PUBLICATIONS

International Search Report and the Written Opinion of the International Searching Authority for International Application No. PCT/US2020/019000 dated Jun. 2, 2020.

*Primary Examiner* — Bo Fan
(74) *Attorney, Agent, or Firm* — Warner Norcross + Judd LLP

(57) ABSTRACT

A system and method for determining an Angle of Arrival (AOA) for frequency modulated communications. The system may include first and second antennas spaced apart from each other by a distance, and configured to receive wireless communications in the form of a frequency modulated signal. The system may determine a phase difference between the received signals irrespective of the modulations in the signal, thereby facilitating determining an AOA.

17 Claims, 9 Drawing Sheets

(51) Int. Cl.
*H03D 7/16* (2006.01)
*H04L 47/11* (2022.01)

(56) References Cited

FOREIGN PATENT DOCUMENTS

JP 2006-284557 10/2006
JP 2017-106834 6/2017

\* cited by examiner

SYSTEM AND METHOD FOR DETERMINING ANGLE OF ARRIVAL FOR COMMUNICATIONS

FIELD OF THE INVENTION

The present application relates to determining an angle of arrival with respect to a wireless signal, and more particularly toward determining an angle of arrival (AOA) for communications.

BACKGROUND

AOA can be computed by comparing the phase of RF signals output from two antennas. Conventional techniques for comparing the RF signals rely in phase locked receivers to compare phase or a single signal commutated receiver to compare the phase during subsequent intervals during a single dedicated section of a message packet communicated in the RF signals.

One conventional type of AOA computation device uses a single dedicated section of the payload of a message packet with a duration in the range of a few microseconds. There are several downsides to this approach. First, the single dedicated section may not be standardized for the communication protocol used to generate the message packet, leaving some devices incapable of understanding the data within the message packet due to the single dedicated section. Second, the single dedicated section may reduce the time allowed for data transmission (e.g., it takes up a portion of the payload). To avoid significant reduction, the single dedicated packet in conventional systems is short in duration, leaving only a brief window for AOA to be determined and therefore the AOA determination can be prone to error. Third, as the single dedicated section becomes shorter, the processing bandwidth becomes larger and so noise-induced errors are likely to increase.

For at least these reasons, conventional phase-based AOA systems are often incompatible with devices that implement a particular communication protocol that has been adapted for AOA determinations. Additionally, these conventional systems are often unable to achieve a workable compromise between the size of the single dedicated section and the size of the payload or data in accordance with the communication protocol.

SUMMARY

A system and method are provided for determining an AOA based on RF signals output from at least two antennas. The RF signals may be representative of an electromagnetic wave received by the at least two antennas. The AOA determination may be based on a phase measurement of the RF signals for an arbitrary length of a standard communications packet received in accordance with a communications protocol. The phase measurement may be determined without compromising the data packet with a dedicated section and for an arbitrary period of time to enhance the accuracy of the phase measurement. This way, the phase measurement can be obtained with respect to any device capable of communicating in accordance with the communications protocol.

In one embodiment, the system may be based on a single, commutated receiver that compares received phase on subsequent sections of a message packet transmitted in accordance with the communications protocol.

In one embodiment, the system may use multiple phase-locked receivers to compare the received phase from both receivers.

In one embodiment, a system is provided for determining an angle of arrival for frequency modulated communications. The system may include a first antenna, a second antenna, and a controller. The first antenna may be capable of wirelessly receiving the frequency modulated communications to generate a first frequency modulated output. The second antenna may be separated by a distance from the first antenna, and capable of wirelessly receiving the frequency modulated communications to generate a second frequency modulated output. The first frequency modulated output and the second frequency modulated output are indicative of the frequency modulated communications arriving at the first and second antennas at different times.

The controller may be configured to determine a phase difference between the first and second frequency modulated outputs received by the first and second antennas, where the phase difference is determined based on unmodulated forms determined from the first and second frequency modulated outputs, and where the phase difference is determined irrespective of frequency modulations in the first and second frequency modulated outputs.

In one embodiment, a method is provided for determining an angle of arrival for frequency modulated communications. The method may include generating a first frequency modulated output based on wireless receipt of the frequency modulated communications in a first antenna, and generating a second frequency modulated output based on wireless receipt of the frequency modulated communications in a second antenna, wherein the second antenna is separated by a distance from the first antenna. The method may also include producing first and second unmodulated forms of the first and second frequency modulated outputs. A phase difference may be determined based on the first and second unmodulated forms such that the phase difference is determined irrespective of frequency modulations in the first and second frequency modulated outputs.

In one embodiment, a system is provided for determining an angle of arrival for a wireless communication signal. The system may include a first antenna capable of wirelessly receiving a first arbitrary length of the wireless communication signal to facilitate generation of a first frequency modulated segment. The system may include a second antenna separated by a distance from said first antenna, and capable of wirelessly receiving a second arbitrary length of the wireless communication signal to facilitate generation of a second frequency modulated segment. The first frequency modulated segment and the second frequency modulated segment may arrive at the first and second antennas at different times, and the first and second modulated segments include frequency modulations representative of data.

The system may include a controller configured to determine a phase difference between the first and second frequency modulated segments received by the first and second antennas, where the phase difference is determined based on unmodulated forms of the first and second frequency modulated segments and irrespective of the frequency modulations representative of data.

In one embodiment, a system is provided for determining an angle of arrival for modulated communications. The system may include a first antenna, a second antenna, and a controller. The first antenna may be capable of wirelessly receiving the modulated communications to generate a first modulated output. The second antenna may be separated by a distance from the first antenna, and may be capable of wirelessly receiving the modulated communications to generate a second modulated output. The first modulated output and the second modulated output may be indicative of the modulated communications arriving at the first and second antennas at different times, and where the modulated communications include a plurality of dedicated portions during which one or more characteristics of the modulated communications are pre-determined.

The controller may be configured to determine a phase difference between the first and second modulated outputs received by the first and second antennas, wherein the phase difference is determined based on one or more samples of the first and second modulated outputs during periods corresponding to the plurality of dedicated portions.

In one embodiment, a method is provided for determining an angle of arrival for modulated communications. The method may include generating a first modulated output based on wireless receipt of the modulated communications in a first antenna, and generating a second modulated output based on wireless receipt of the modulated communications in a second antenna. The second antenna may be separated by a distance from the first antenna. The method may include sampling the first and second modulated outputs corresponding to at least a portion of a plurality of dedicated sections of the modulated communications, and determining a phase difference based on samples of the first and second modulated outputs.

In one embodiment, a transmission device is provided for facilitating determining an angle of arrival for a wireless communication signal transmitted from the transmission device. The transmission device may include an antenna array configured to transmit the wireless communication signal via an electromagnetic waveform provided to remote device. The antenna array may include one or more antennas. The transmission device may include a communication interface including a transmitter configured to transmit a plurality of message packets in the wireless communication signal. The plurality of message packets may include a dedicated portion during which one or more characteristics of the wireless communication signal are pre-determined, and where presence of the dedicated portion in the wireless communication signal facilitates determining an angle of arrival for the wireless communication signal relative to the remote device. The one or more characteristics may be pre-determined prior to transmission of the dedicated portion. As an example, the communication interface may determine the one or more characteristics in conjunction with transmitting a message packet that includes the dedicated portion. The one or more characteristics may be communicated in the data packet prior to transmission of the dedicated portion.

The communication interface may be configured to dynamically vary the one or more characteristics of the dedicated portion such that the one or more characteristics for a first dedicated portion of a first message packet are different form the one or more characteristics for a second dedicated portion of a second message packet. The communication interface may be configured to communicate dedicated portion information pertaining to the one or more characteristics to the remote device prior to transmission of the dedicated portion.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DETAILED DESCRIPTION

A system and method for determining an Angle of Arrival (AOA) for frequency modulated communications are provided in connection with one or more embodiments of the present disclosure. The system may include first and second antennas spaced apart from each other by a distance. Both the first and second antennas may be configured to receive wireless communications in the form of a frequency modulated signal. The system may determine a phase difference between the received signals irrespective of the modulations in the signal, thereby facilitating determining an AOA. It is noted that AOA may not be determined solely in accordance with one or more embodiments described herein. AOA determinations may be supplemented in accordance with one or more other techniques, including AOA determinations based on amplitude or a hybrid of amplitude and phase.

Figure 1:
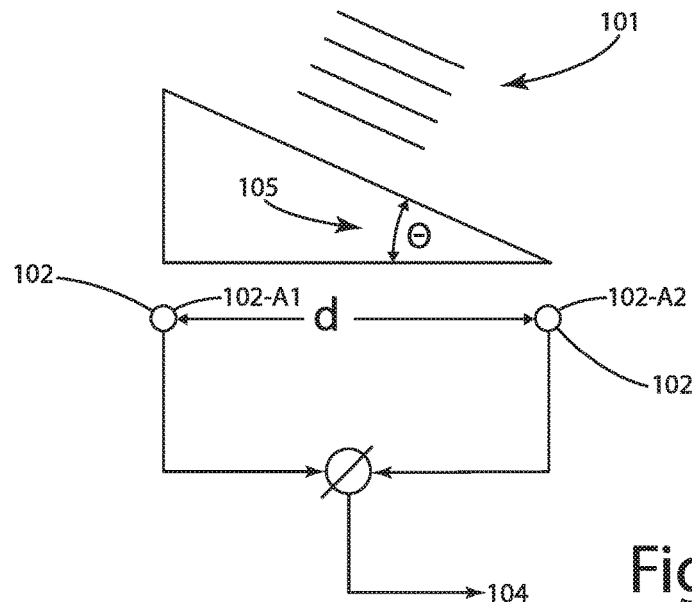
FIG. 1 is a representative view of two antennas configured to receive an electromagnetic wave and depicts an angle of arrival of the wave relative to the two antennas.
Figure 2:
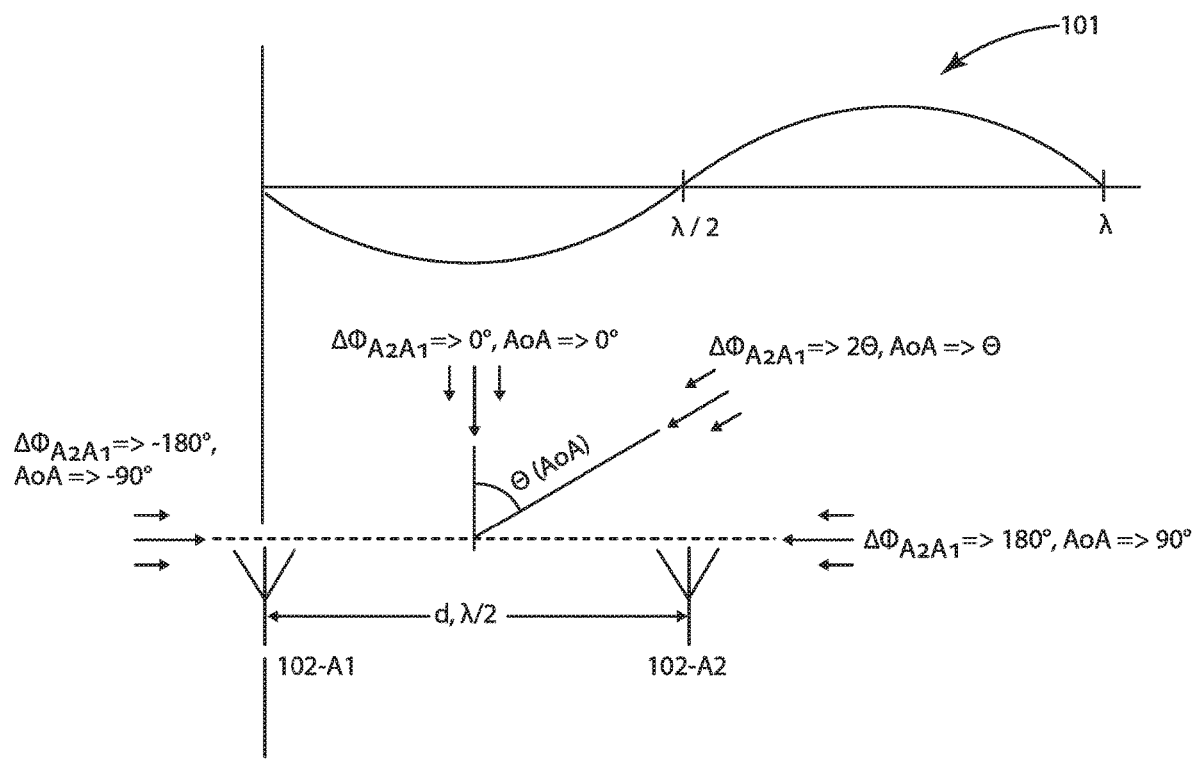
FIG. 2 is another representative view of two antennas configured to receive an electromagnetic wave and depicts an angle of arrival of the wave relative to the two antennas.

First and second antennas 102-A1, 102-A2 are shown in the illustrated embodiments of FIGS. 1 and 2 in accordance with one embodiment of the present disclosure. The first and second antennas 102-A1, 102-A2 may be separated by a distance d and configured to receive electromagnetic waves propagating through space from a source. In one embodiment, such as the one depicted in the illustrated embodiment of FIG. 3, the source of the electromagnetic waves may be a portable device 20, and the first and second antennas 102-A1, 102-A2 may form an antenna array 30 disposed on an object 10. The present disclosure is not limited to an antenna array 30 having first and second antennas 102—the antenna array 30 may include one or more antennas 102, including three or more antennas 102 provided in a spaced-apart configuration. Optionally, the beam of one or more antennas 102 of a plurality in the antenna array 30 may be different from another beam of at least one other antenna 102 of the plurality. Differences in the beam may include directionality (e.g., omnidirectional or directional), and gain, or a combination thereof.

In the illustrated embodiment of FIGS. 1 and 2, the first and second antennas 102-A1, 102-A2 are separated by a distance d, and configured to receive the plane wave 101 having a frequency (e.g., a carrier frequency) corresponding to a wavelength k. Each antenna 102-A1, 102-A2 may output a waveform signal corresponding to components of the plane wave 101 detected by the antenna 102-A1, 102-A2. For purposes of discussion, the distance d separating the first and second antennas 102-A1, 102-A2 is half the wavelength $\lambda$ of the frequency of the plane wave 101. This way, the AOA of the plane wave 101 relative to the first and second antennas 102-A1, 102-A2 is half the phase difference of the waveform signal output from the first and second antennas 102-A1, 102-A2. This phase difference may be output as a phase difference signal 104, which, in one embodiment, has a voltage corresponding to a value of the phase difference (e.g., 2.5V=>0°, 5V=>° 90, 0V=>)−90°.

In one example, if the source of the plane wave 101 impinging the first and second antennas 102-A1, 102-A2 is positioned at 90° to the first and second antennas 102-A1, 102-A2, the waveform signal output from the second antenna 102-A2 leads the waveform signal output from the first antenna 102-A1 by 180°. By determining the phase difference between the wave form signals output from the first and second antennas 102-A1, 102-A2, the AOA can be identified. In this example, by determining the phase difference is 180°, and with the distance d being half the wavelength $\lambda$, the AOA can be determined as 90°. As another example, if the phase difference of the waveform signals output from the first and second antennas 102-A1, 102-A2 is 0°, the AOA can be determined as 0°. And if the phase difference of the waveform signals output from the first and second antennas 102-A1, 102-A2 is −180°, the AOA can be determined as −90°.

Based on these examples it can be seen that, with the distance d being half the wavelength $\lambda$, the AOA is half the phase difference determined with respect to the plane wave 101 detected by the first and second antennas 102-A1, 102-A2. The distance d may vary from application to application and need not be half the wavelength $\lambda$. Rather, this distance d is provided to facilitate understanding with respect to FIG. 2, and to demonstrate that the AOA may be determined as a function of the phase difference determined with respect to the plane wave 101 detected by the first and second antennas 102-A1, 102-A2.

For purposes of disclosure, the example in FIG. 2 is described in conjunction with determining AOA for receipt of a plane wave 101 impinging two antennas 102. A waveform signal output from additional antennas may be compared against the waveform signals noted above for determining AOA with further confidence or AOA in three-dimensions, or both. For instance, with three antennas 102 separated from each other such that each antenna 102 is separated from an adjacent antenna 102 by distance d (forming an equilateral triangle), the AOA may be determined in three dimensional space rather than relative to a projection of the source location onto a plane in accordance with one embodiment.

I. System Overview

Figure 3:
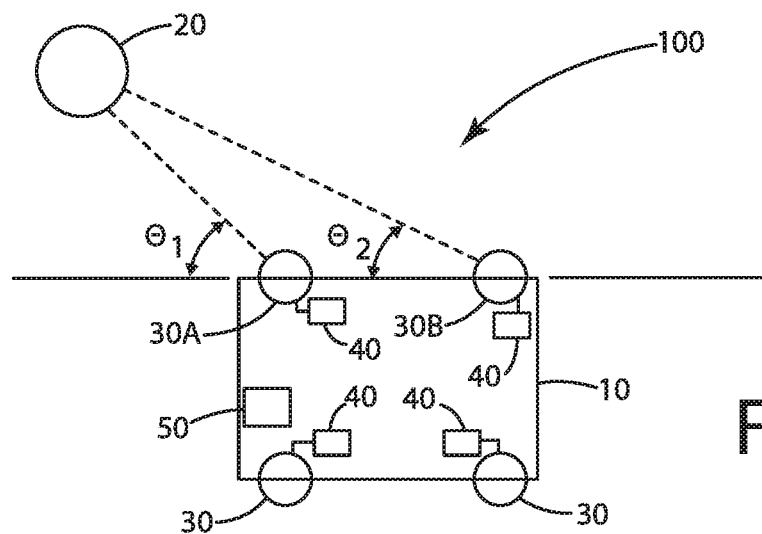
FIG. 3 is a system in accordance with one embodiment.

A system in accordance with one embodiment is shown in the illustrated embodiment of FIG. 3 and generally designated 100. The system 100 may include one or more system components as outlined herein. A system component may be a user or an electronic system component, which may be the portable device 20, a sensor 40, and an object component 50. The object component 50, as discussed herein, may be configured to operate as any one or more of these devices. In this sense, in one embodiment, there may be several aspects or features common among the portable device 20, the sensor 40, and the object component 50. In other words, the features described in connection with the object component 50 depicted in FIG. 4 may be incorporated into the portable device 20 or the sensor 40, or both. In one embodiment, the object component 50 may form an equipment component disposed on an object 10, such as a vehicle or a building. The object component 50 may be communicatively coupled to one or more systems of the object 10 to control operation of the object 10, to transmit information to the one or more systems of the object 10, or to receive information from the one or more systems of the object 10, or a combination thereof.

The object component 50 may include one or more processors 51 that execute one or more applications 57 (software and/or includes firmware), one or more memory units 52 (e.g., RAM and/or ROM), and one or more communication interfaces 53, amongst other electronic hardware. The object component 50 may or may not have an operating system 56 that controls access to lower-level devices/electronics via a communication interface 53. The object component 50 may or may not have hardware-based cryptography units 55—in their absence, cryptographic functions may be performed in software. The object component 50 may or may not have (or have access to) secure memory units 54 (e.g., a secure element or a hardware security module (HSM)). Optional components and communication paths are shown in phantom lines in the illustrated embodiment.

The system 100 in the illustrated embodiment of FIG. 3 is not dependent upon the presence of a secure memory unit 54 in any component. In the optional absence of a secure memory unit 54, data that may otherwise be stored in the secure memory unit 54 (e.g., private and/or secret keys) may be encrypted at rest (when possible). Both software-based and hardware-based mitigations may be utilized to substantially prevent access to such data, as well as substantially prevent or detect, or both, overall system component compromise. Examples of such mitigation features include implementing physical obstructions or shields, disabling JTAG and other ports, hardening software interfaces to eliminate attack vectors, using trusted execution environments (e.g., hardware or software, or both), and detecting operating system root access or compromise.

For purposes of disclosure, being secure is generally considered being confidential (encrypted), authenticated, and integrity-verified. It should be understood, however, that the present disclosure is not so limited, and that the term "secure" may be a subset of these aspects or may include additional aspects related to data security.

The communication interface 53 may be any type of communication link, including any of the types of communication links describe herein, including wired or wireless. The communication interface 53 may facilitate external or internal, or both, communications. For instance, the communication interface 53 may be coupled to or incorporate the antenna array 30.

As another example, the communication interface 53 may provide a wireless communication link with another object component 50 in the form of the portable device 20, such as wireless communications according to the WiFi standard. In another example, the communication interface 53 may be configured to communicate with an equipment component of a vehicle (e.g., a vehicle component) via a wired link such as a CAN-based wired network that facilitates communication between a plurality of devices. The communication interface 53 in one embodiment may include a display and/or input interface for communicating information to and/or receiving information from a user 60.

Figure 4:
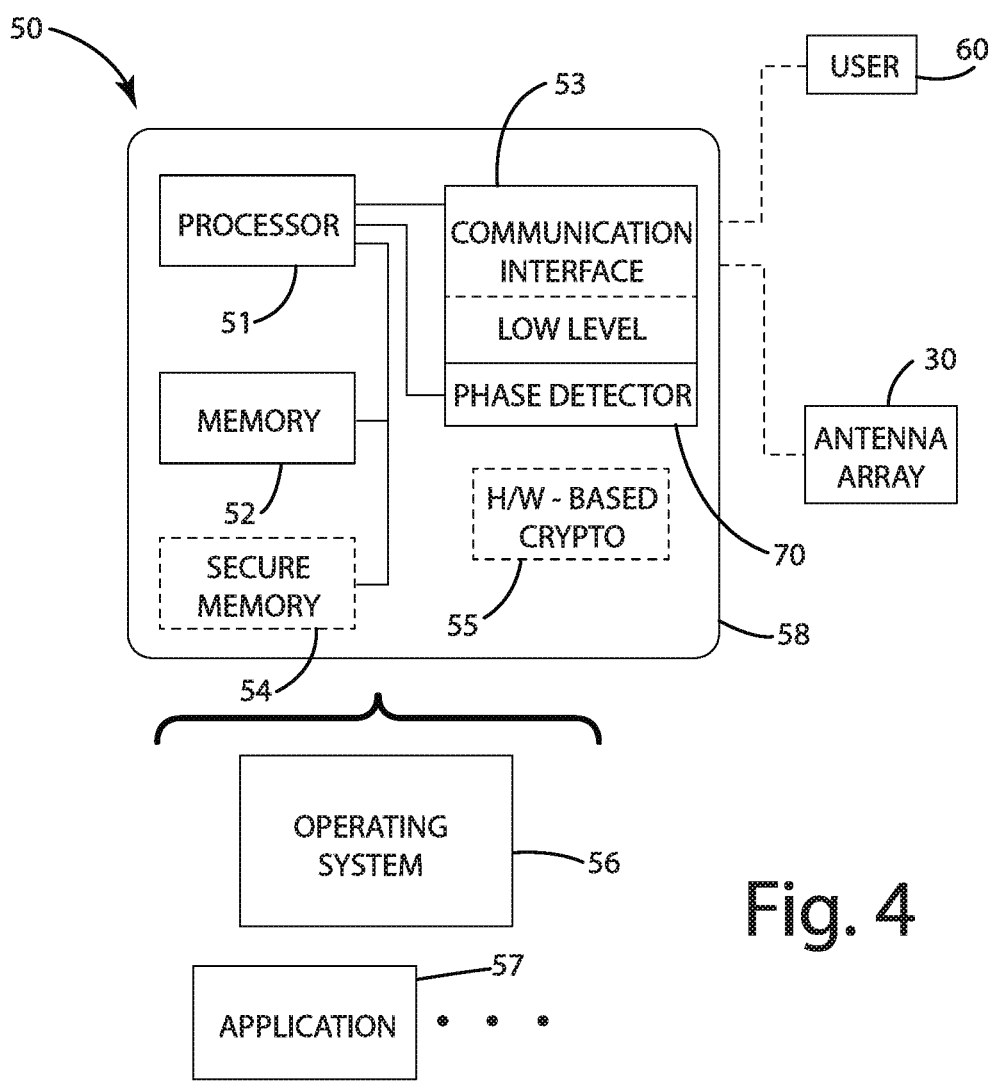
FIG. 4 is a representative view of a device in accordance with one embodiment.

In one embodiment, shown in FIG. 4, the object component 50 may be configured to communicate with one or more auxiliary devices other than another object component 50 or a user. The auxiliary device may be configured differently from the object component 50—e.g., the auxiliary device may not include a processor 51, and instead, may include at least one direct connection and/or a communication interface for transmission or receipt, or both, of information with the object component 50. For instance, the auxiliary device may be a solenoid that accepts an input from the object component 50, or the auxiliary device may be a sensor (e.g., a proximity sensor) that provides analog and/or digital feedback to the electronic system component 200.

The system 100 in the illustrated embodiment may be configured to determine location information in real-time with respect to the portable device 20. In the illustrated embodiment of FIG. 3, the user 60 may carry the portable device 20 (e.g., a smartphone). The system 100 may facilitate locating the portable device 20 with respect to the object 10 (e.g., a vehicle) in real-time with sufficient precision to determine whether the user is located at a position at which access to the object or permission for an object command should be granted.

For instance, in an embodiment where the object 10 is a vehicle, the system 100 may facilitate determining whether the portable device 20 is outside the vehicle but in close proximity, such as within 5 feet, 3 feet, or 2 feet or less, to the driver-side door. This determination may form the basis for identifying whether the system 100 should unlock the vehicle. On the other hand, if the system 100 determines the portable device 20 is outside the vehicle and not in close proximity to the driver-side door (e.g., outside the range of 2 feet, 3 feet, or 5 feet), the system 100 may determine to lock the driver-side door. As another example, if the system 100 determines the portable device 20 is in close proximity to the driver-side seat but not in proximity to the passenger seat or the rear seat, the system 100 may determine to enable mobilization of the vehicle. Conversely, if the portable device 20 is determined to be outside close proximity to the driver-side seat, the system 100 may determine to immobilize or maintain immobilization of the vehicle.

The object 10 may include multiple object components 50 or variant thereof, such as a sensor 40 coupled to an antenna array 30 in accordance with one or more embodiments described herein. The sensor 40 may be configured to determine an angle of arrival with respect to communications with the portable device 20, based at least in part on a phase difference determined with respect to communications received by two or more of the antennas 102 of the antenna array 30.

Micro-location of the portable device 20 may be determined in a variety of ways, such as using information obtained from a global positioning system, one or more signal characteristics of communications from the portable device 20, and one or more sensors (e.g., a proximity sensor, a limit switch, or a visual sensor), or a combination thereof. An example of microlocation techniques for which the system 100 can be configured are disclosed in U.S. Non-provisional patent application Ser. No. 15/488,136 to Raymond Michael Stitt et al., entitled SYSTEM AND METHOD FOR ESTABLISHING REAL-TIME LOCATION, filed Apr. 14, 2017—the disclosure of which is hereby incorporated by reference in its entirety.

In one embodiment, in the illustrated embodiment of FIG. 3, the object component 50 (e.g., a system control module (SCM)) and a plurality of sensors 40 (coupled to an antenna array 30) may be disposed on or in a fixed position relative to the object 10. Example use cases of the object 10 include the vehicle identified in the prior example, or a building for which access is controlled by the object component 50. The sensors 40 in the illustrated embodiment may be incorporated or be coupled to one or more antennas 102 as described herein. The arrangement or position of the sensors 40 may be in accordance with one or more embodiments described herein. Signal processing of the object component 50 may be in accordance with one or more embodiments described herein.

The portable device 20 may communicate wirelessly with the object component 50 via a communication link. The plurality of sensors 40 may be configured to sniff the communications between the portable device 20 and the object component 50 to determine one or more signal characteristics of the communications, such as signal strength or angle of arrival, or both. The determined signal characteristics may be communicated or analyzed and then communicated to the object component 50 via a communication link separate from the communication link between the portable devices 20 and the object component 50. Additionally, or alternatively, the portable device 20 may establish a direct communication link with one or more of the sensors 40, and the one or more signal characteristics may be determined based on this direct communication link.

As an example, as shown in the illustrated embodiment, the angle of arrival with respect to communications transmitted to antenna arrays 30A, 30B may vary depending on the location of the portable device 20 relative to the antenna arrays 30A, 30B. At the position shown in the illustrated embodiment of FIG. 3, the portable device 20 may transmit communications that arrive at the antenna array 30A at a first angle $\theta_1$ and arrive at the antenna array 30B at a second angle $\theta_2$, which is more acute or smaller than the first angle $\theta_1$. Based on at least these two angles of arrival, a position of the portable device 20 may be determined or an accuracy of a position of the portable device 20 determined in conjunction with one or more other sensed characteristics may be increased.

As described herein, one or more signal characteristics, such as signal strength and angle of arrival, may be analyzed to determine location information about the portable device 20 relative to the object 10, an aspect of the object 10, or the object component 50, or a combination thereof. For instance, time difference of arrival or the angle of arrival, or both, among the sensors 40 and the object component 50 may be processed to determine a relative position of the portable device 20. The positions of the one or more antenna arrays 30 relative to the object component 50 may be known so that the relative position of the portable device 20 can be translated to an absolute position with respect to the antenna arrays 30 and the object component 50.

Additional or alternative examples of signal characteristics may be obtained to facilitate determining position according to one or more algorithms, including a distance function, trilateration function, a triangulation function, a multilateration function, a fingerprinting function, a differential function, a time of flight function, a time of arrival function, a time difference of arrival function, an angle of departure function, a geometric function, etc., or any combination thereof.

II. Phase Detector

A phase detection component 70 in accordance with one or more embodiments may be incorporated into the system 100 to determine a phase difference between waveform signals output from two or more antennas 102. The phase detection component 70 may be incorporated into the communication interface 53 of the sensor 40 in accordance with one embodiment. The phase detection component 70 in one embodiment may form a receiver capable of demodulating communications received via the waveform signals output from the two or more antennas 102.

The phase detection component 70 may be configured to generate a phase difference output, such as the phase difference signal 104 described in conjunction with the illustrated embodiments of FIGS. 1 and 2. The phase difference output may be any type of output indicative of a phase difference, including, for example, an analog signal with a voltage representative of the phase difference, a PWM signal with a duty cycle representative of the phase difference, a serial set of bits representative of the phase difference that can be communicated to another component, and a memory register in which the phase difference is stored, or any combination thereof.

Based on the phase difference of the waveform signals output from first and second antennas 102, the system 100 may determine an angle of arrival with respect to the electromagnetic wave that generated the waveform signals output from the first and second antennas 102. In the illustrated embodiment, the wave is generated by the portable device 20, but it should be understood that the wave may be generated by any component of the system 100, including from a sensor 40.

An example of a function for determining an angle of arrival based on a phase difference between waveform output signals from first and second antennas 102 is described in conjunction with the illustrated embodiments of FIGS. 1 and 2. The angle of arrival may be determined in the object component 50, or the sensor 40, or any component of the system 100, or any combination thereof. In one embodiment, the angle of arrival may be determined with respect to multiple pairs of antennas 102 (e.g., a first antenna 102 and a second antenna 102, the second antenna 102 and a third antenna 102, and the first antenna 102 and the third antenna 102). Based on the angle of arrival for one or more pairs of antennas 102, information about the position of the portable device 20 may be determined.

The electromagnetic wave generated by the portable device 20, or another component of the system 100, may vary depending on the application and whether communications (e.g., data bits) are being transmitted. In one embodiment, the electromagnetic wave may include a carrier wave having a frequency FC. The electromagnetic wave may remain substantially constant at the frequency FC or another frequency with no communications and no modulations. For instance, the electromagnetic wave may be substantially constant for its entire duration or may be substantially constant for a period of time.

In one embodiment, the electromagnetic wave may be modulated to transmit communications from a first device to a second device. The communications may include data a) generated and transmitted from the first device and b) received and processed by the second device. The modulation scheme utilized for transmission of communications may vary from application to application. Example modulation schemes include frequency shift keying (FSK), amplitude shift keying (ASK), minimum shift keying (MSK), and Gaussian minimum shift keying (GMSK).

Figure 5:
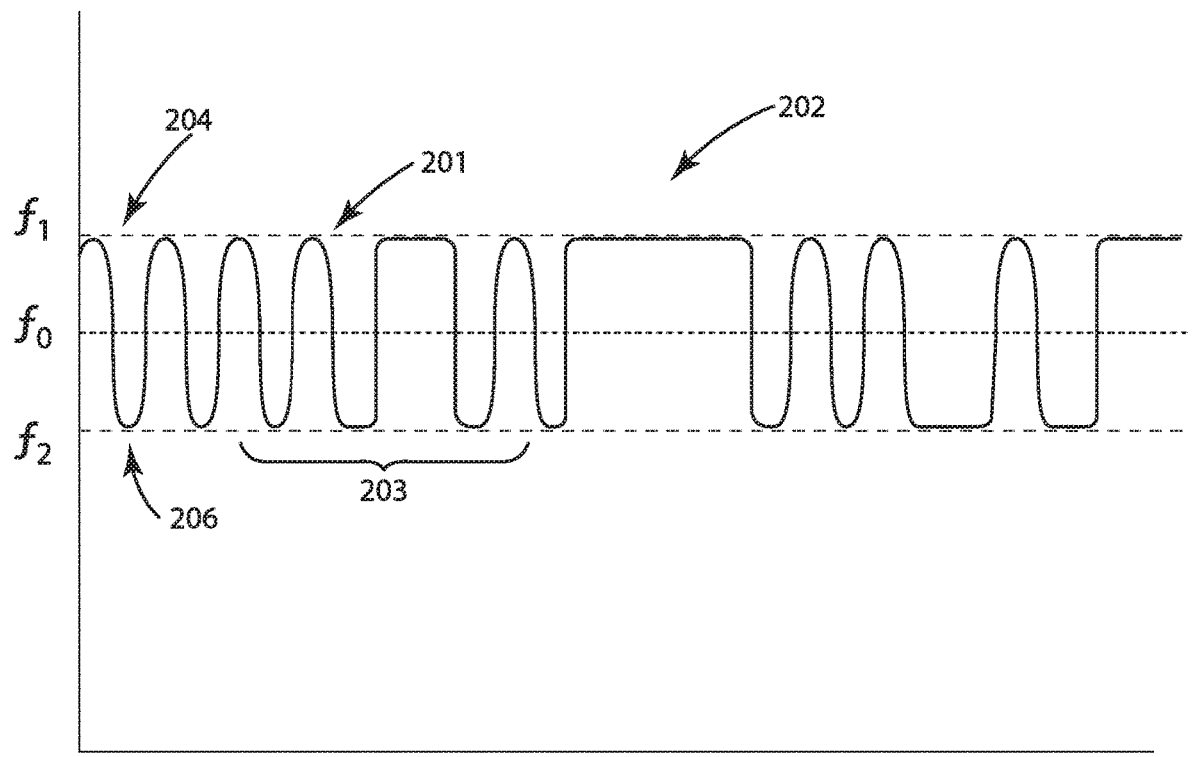
FIG. 5 is a representative view of RF communications with encoded data in accordance with one embodiment.

A representation of modulations on an electromagnetic wave in accordance with one embodiment is shown in FIG. 5. The diagram in the illustrated embodiment depicts frequency versus time for a GMSK frequency modulated waveform with symbols (e.g., data bits) represented by first and second frequencies 204, 206 respectively at f1, f2, which may be centered about a center frequency f0. In other words, the electromagnetic waveform 201 shown in FIG. 5 is a 2-level (or two symbol) GMSK Frequency Modulation (FM) waveform.

In the illustrated embodiment, changing from the first frequency 204 to the second frequency 206 from the second frequency 206 to the first frequency 204 may facilitate transmission of symbols or communications via the electromagnetic wave. An example of this mode of communication includes a center frequency at 2.402 MHz and the first and second frequencies 204, 206 respectively at +180 kHz and −180 kHz relative to the center frequency.

It is noted that GMSK has characteristics that make it useful for phase-based AOA. For instance, when transmitting a sequence of the same symbol, the frequency may remain substantially constant or stable and not change. Additionally, when changing from one symbol to another, the phase in GMSK may be continuous.

In one embodiment, as discussed herein, the phase difference output may be determined with respect to a portion 203 of the electromagnetic waveform that includes modulations. Because changes due to modulations may occur at different points in time of the electromagnetic wave, and because the first and second antennas 102 of a phase detector in one embodiment may be separated by a distance d, the phase detector may be determining a phase difference between a first waveform output at the first frequency 204 and a second waveform output at the second frequency 206. For instance, at or near the transition from the first frequency 204 to the second frequency 206, the first antenna 102 (if closer to the electromagnetic waveform source) may output a waveform signal that corresponds to the second frequency 206 while at the same time the second antenna 102 (if farther away from the electromagnetic waveform source) may output a waveform signal that still corresponds to the first frequency 204.

One embodiment according to the present disclosure may remove the modulations from the waveform output signals generated by the first and second antennas 102, thereby providing a comparison based on unmodulated forms of the waveform output signals. As an example, the waveform output signals from the first antenna 102 and the second antenna 102 may be processed to yield unmodulated waveform output signals having a common frequency (e.g., the carrier frequency) without modulations. The phases of the two unmodulated waveform output signals can be compared against each other to yield a phase difference output in accordance with one embodiment. The modulations may be dynamically removed from the waveform output signals—that is, instead of knowing beforehand what the modulations will be in order to remove them from the waveform output signals, the modulations may be determined from the waveform output signal and removed therefrom in a dynamic manner.

In one embodiment, by removing the modulations from the waveform output signals, a phase difference can be determined for the waveform output signals generated from the first and second antennas 102 for periods of time substantially longer than a message packet in accordance with a communication protocol, a portion of such a message packet, or a duration between message packets, or any combination thereof. For purposes of disclosure, the message frame may be an Ethernet packet or a packet similar to the one depicted in the illustrated embodiment of FIG. 7. In other words, it is not necessary in one embodiment to wait until the waveform output signals are known to share a common frequency in order to determine a phase difference output for the two signals. The phase difference output can be determined with respect to the waveform output signals from first and second antennas 102 irrespective of any frequency modulations in the electromagnetic wave that provides the basis for the waveform output signals.

In an alternative embodiment, the phase difference output may be determined based on a comparison of the waveform output signals for a dedicated or assigned portion 202 of the electromagnetic waveform. The dedicated portion 202 of the electromagnetic waveform may provide a period during which one or more aspects of the electromagnetic waveform 201 are known or pre-determined, and therefore facilitate determining the phase difference. Pre-determination of the dedicated portion 202 may be include dynamically determining one or more aspects of the dedicated portion 202 (e.g., time location within a message packet, a duration, or a modulation content, or a combination thereof) before transmission of the dedicated portion 202. In one embodiment, these one or more aspects may be communicated to a receiver in the same message packet as the dedicated portion 202 but prior to transmission of the dedicated portion 202.

To provide some examples of the dedicated portion 202, if during the dedicated portion 202, the frequency and phase of the electromagnetic waveform 201 remain substantially constant, a phase comparison between to RF signals output from the first and second antennas 102-A1, 102-A2 may be conducted without the need to condition the RF signals for changes in frequency or phase, or both, of the electromagnetic waveform 201. As another example, modulations in frequency or phase, or both, of the electromagnetic waveform 201 may be established before transmission or may be known by the receiver so that these modulations can be accounted for in determining the phase difference. Examples of accounting for the modulations includes generating an unmodulated form of the RF signals in accordance with one or more embodiments herein, or confining the sampling periods for determining phase to portions of the RF signals that share one or more common characteristics, e.g., sampling while Os are being transmitting and avoiding sampling during transitions due to the modulations. In another example, the sampling periods may be determined so that RF signals are substantially the same with respect to frequency and phase, and optionally obtained during different periods of time.

The timing or one or more characteristics, or a combination thereof, of the dedicated portion 202 of the electromagnetic waveform 201 may be determined dynamically, e.g., by a transmitter before transmission of a message packet. The transmitter may be incorporated into the communication interface 53 of the device 50.

Additionally, or alternatively, the timing or one or more characteristics, or a combination thereof, of the dedicated portion 202 of the electromagnetic waveform 201 may be established in accordance with a communication protocol standard (e.g., WiFi). As an example, the time position and duration of the dedicated portion 202 of the electromagnetic waveform 201 may be established for the communication protocol so that devices that communicate using this protocol are aware that the dedicated portion 202 is present in communications, and that the dedicated portion 202 may be used as a basis for determining a phase difference output with respect to waveform output signals that share a common frequency characteristic. Examples of one or more characteristics of the dedicated portion 202 that may be determined dynamically or established in accordance with a communication protocol standard include a frequency of transmission, a duration of transmission, and a timing location within a message packet. For instance, in the illustrated embodiment of FIG. 5, the dedicated portion 202 is provided at the first frequency F1 in between modulations representative of symbols such that, during the dedicated portion 202 for phase measurement, a single symbol is repeated (represented by frequency F1, 204).

One or more aspects of the dedicated portion 202 that can be varied between message packets 600. For instance, the timing location of the dedicated portion 202 in the message packet 600 may be different for one message packet versus another message packet. In other words, the timing location in one message packet may be different from the timing location in another packet. This way, the attempts to fake a phase difference (and a resulting angle of arrival determination) can be rendered ineffective. For instance, if a bad device attempts to fake a phase difference, the bad device would need to know the correct location of the dedicated portion 202 to generate one or more electromagnetic waves to fake a phase difference.

The one or more aspects varied for the dedicated portion 202 may be communicated to the phase detection component 70 to facilitate use of the dedicated portion 202 in determining the phase difference. In one embodiment, the one or more characteristics of the dedicated portion 202 to be transmitted in a first message packet 600 are communicated in the first message packet 600 but prior to transmission of the dedicated portion 202 therein. Additionally, or alternatively, the one or more aspects of the dedicated portion 202 may be communicated to the phase detection component 70 in an encrypted form. A shared key may be established between the phase detection component 70 and the transmitter of the electromagnetic wave 201 to facilitate encryption of the information including the one or more aspects of the dedicated portion 202 to be communicated to the phase detection component 70.

In one embodiment, the dedicated portion 202 may not have a constant frequency characteristic. For instance, the dedicated portion 202 may include modulations corresponding to symbols that are defined prior to transmission of the dedicated portion 202. This way, the phase detector may remove the modulations based on their known values, or sample the dedicated portion 202 for one or more periods that substantially exclude the transition periods from one frequency to another. By knowing the timing of the modulations, the one or more periods may be determined to avoid adverse effects on phase difference measurements due to sampling of the transition periods. The symbols for the dedicated portion 202 may be communicated in a secure manner to the phase detector before transmission, allowing the symbols to be determined dynamically or in a manner that can vary from one message packet to another message packet.

In one embodiment, there may be a plurality of dedicated portions 202 dispersed throughout the message packet. The locations of these dedicated portions 202 may remain static or the same in accordance with a standard. Additionally, or alternatively, the locations of the dedicated portions 202 can vary from one message packet to another message packet. The locations may be communicated as part of the message packet or in a previous message packet, optionally in a secure manner. By varying the locations of the dedicated portions 202, a bad device, which attempts to fake the system into determining an incorrect phase difference that is beneficial to the bad device, may be rendered ineffective.

In the illustrated embodiment of FIGS. 7A-7E, a message packet in accordance with one embodiment of communications is shown and designated 600. The message packet 600 may be defined to include a plurality of bit fields, including a preamble, an address, a payload and a frame sequence check. The type and number of bit fields may vary based on the communication protocol (e.g., the data link layer of the communication protocol). The message packet 600 in the illustrated embodiment may be transmitted as a series of symbols from left to right via the electromagnetic waveform 201. As discussed herein, the dedicated portion 202 or a plurality thereof may be provided in the message packet 600. The location or locations of the dedicated portion 202 and the bit sequence of each dedicated portion 202 may remain static or may be dynamic for a communication session for a transmitter (e.g., the portable device 20) and a receiver (e.g., the antenna array 30 and sensor 40). An example dynamic aspect of the dedicated portion 202 include differences in the bit sequence of a dedicated portion 202 relative to another dedicated portion 202 (within the same message packet or another message packet, or a combination thereof). Another example dynamic aspect of the dedicated portion 202 is the location or locations of a dedicated portion 202 or a plurality thereof within the message packet 600 being different from the location or locations of a dedicated portion 202 or a plurality thereof within another message packet 600. The dynamic aspects of the dedicated portion 202 within a message packet 600 may be communicated to the phase detection component 70 prior to transmission of a message packet 600 or within the message packet 600 but prior to occurrence of the dedicated portion 202.

FIGS. 7B-7E depict a dedicated portion 202 of the message packet 600 in accordance with one or more embodiments of the present disclosure, showing an enlarged view with respect to the dedicated portion 202 in FIG. 7A and showing related aspects of the timing of the message packet 600 and the phase detection component 70. The dedicated portion 202 in the illustrated embodiment is provided in the payload field of the message packet 600—but the present disclosure is not so limited. The dedicated portion 202 may be provided at one or more other locations of the message packet 600.

The illustrated embodiment of FIG. 7B shows that the bit values of the payload field of the message packet 600 may vary. That is, the portion of the message packet 600 that is identified as the dedicated portion 202 may not be the dedicated portion 202 in one message packet 600 but may be the dedicated portion 202 in another message packet 600. Additionally, or alternatively, the bit values of the dedicated portion 202 in one message packet 600 may be different from the bit values of the dedicated portion 202 in another message packet 600.

Figure 7:
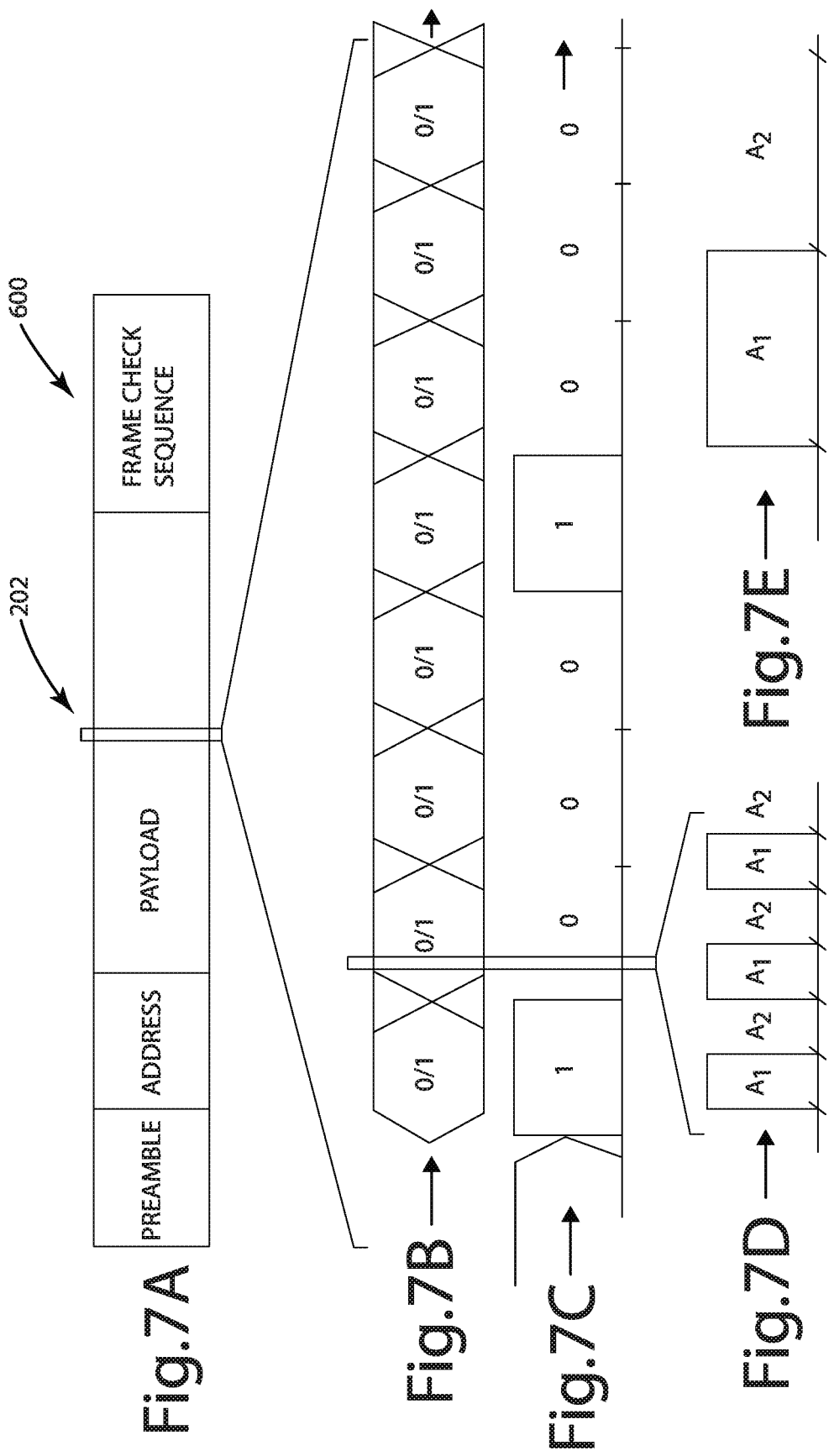
FIG. 7A shows a message packet in accordance with one embodiment.
FIG. 7B shows a data stream within the message packet that corresponds to a dedicated portion for determining a phase difference in accordance with one embodiment.
FIG. 7C shows data values for the dedicated portion in accordance with one embodiment.
FIG. 7D shows a control signal or switch input for switching between first and second antennas in accordance with one embodiment.
FIG. 7E shows a control signal or switch input for switching between first and second antennas in accordance with one embodiment.

For purposes of discussion, the bit values for a dedicated portion 202 in accordance with one embodiment are depicted in FIG. 7C. The dedicated portion 202 in FIG. 7 includes a repeated sequence 1000, with the 1 indicating a start of each sequence.

The phase detection component 70 may determine a phase difference between RF signals output from the first and second antennas 102-A1, 102-A2 based on samples of the RF signals output from the first and second antennas 102-A1, 102-A2 during the dedicated portion 202. The RF signals output from the first and second antennas 102-A1, 102-A2 may be sampled simultaneously or at different times. As an example, if the RF signals are sampled at different times, the samples may be obtained with respect to substantially similar sections (e.g., the same type of modulation) of the dedicated portion 202—such as the sections identified by Os in FIG. 7C. Alternatively, as discussed herein, the samples may be obtained at different times and regardless of any modulations in the RF signals output (e.g., regardless of whether the sampled sections are dissimilar in the type of modulation) from the first and second antennas 102-A1, 102-A2, where the modulations are removed from the RF signals to facilitate a comparison of phase between the RF signals that is indicative of an angle of arrival.

Figure 6:
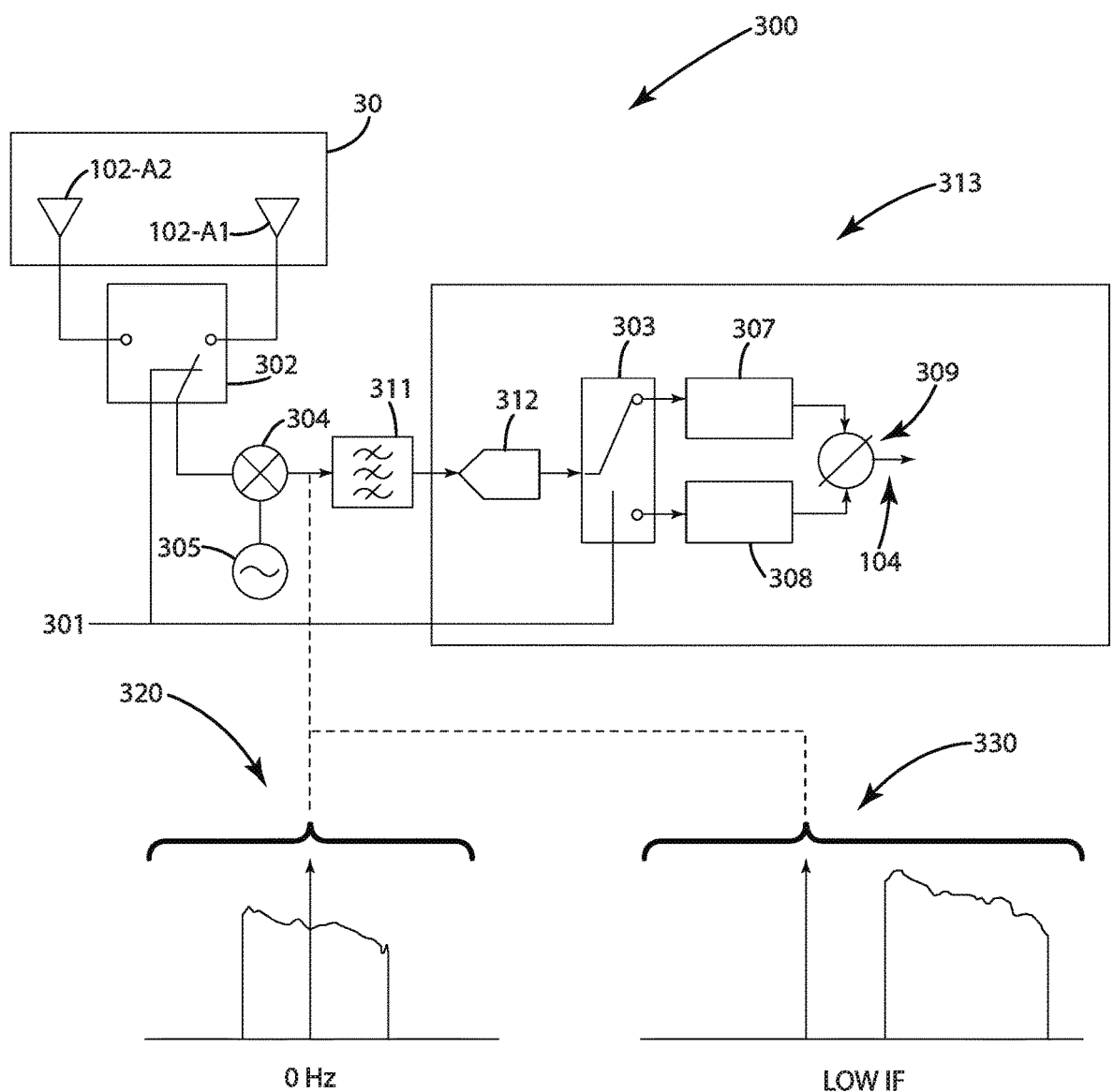
FIG. 6 depicts first and second antennas coupled to a phase detector in accordance with one embodiment.
Figure 8:
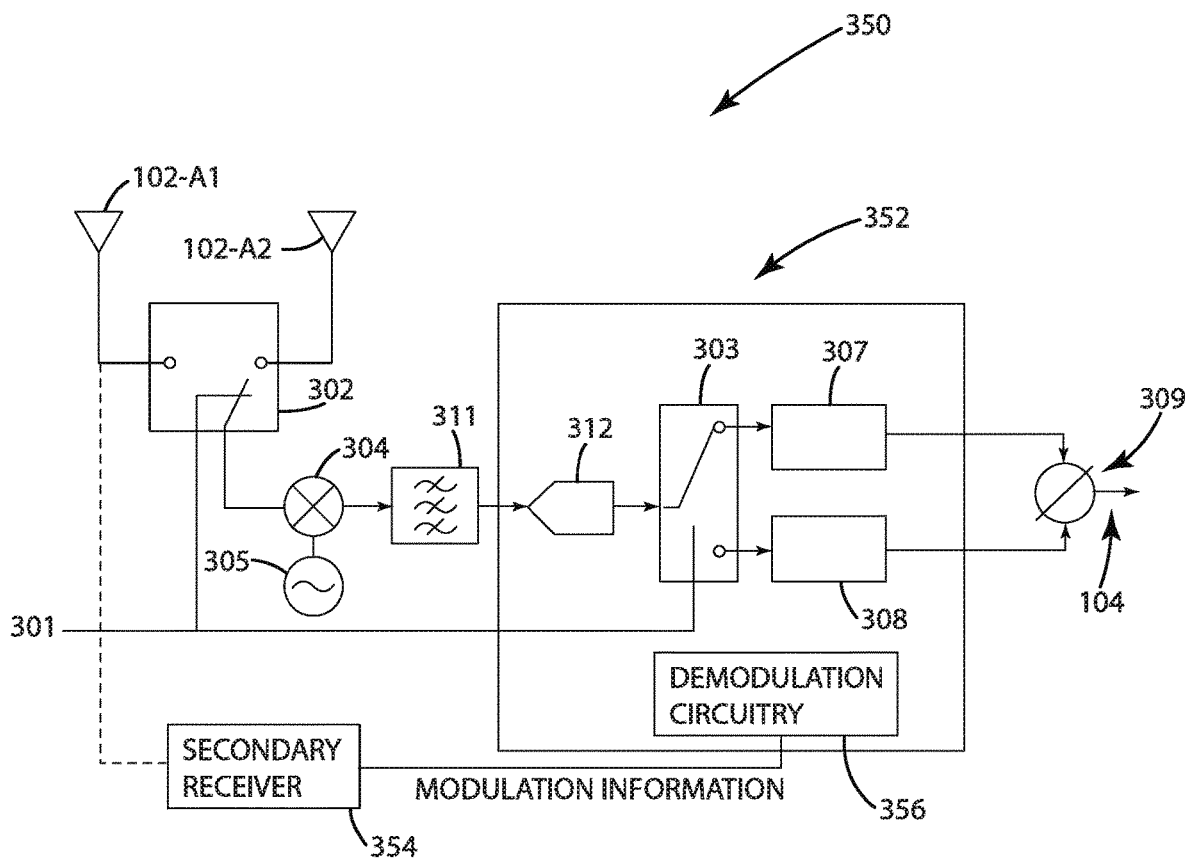
FIG. 8 depicts first and second antennas coupled to a phase detector in accordance with one embodiment.
Figure 10:
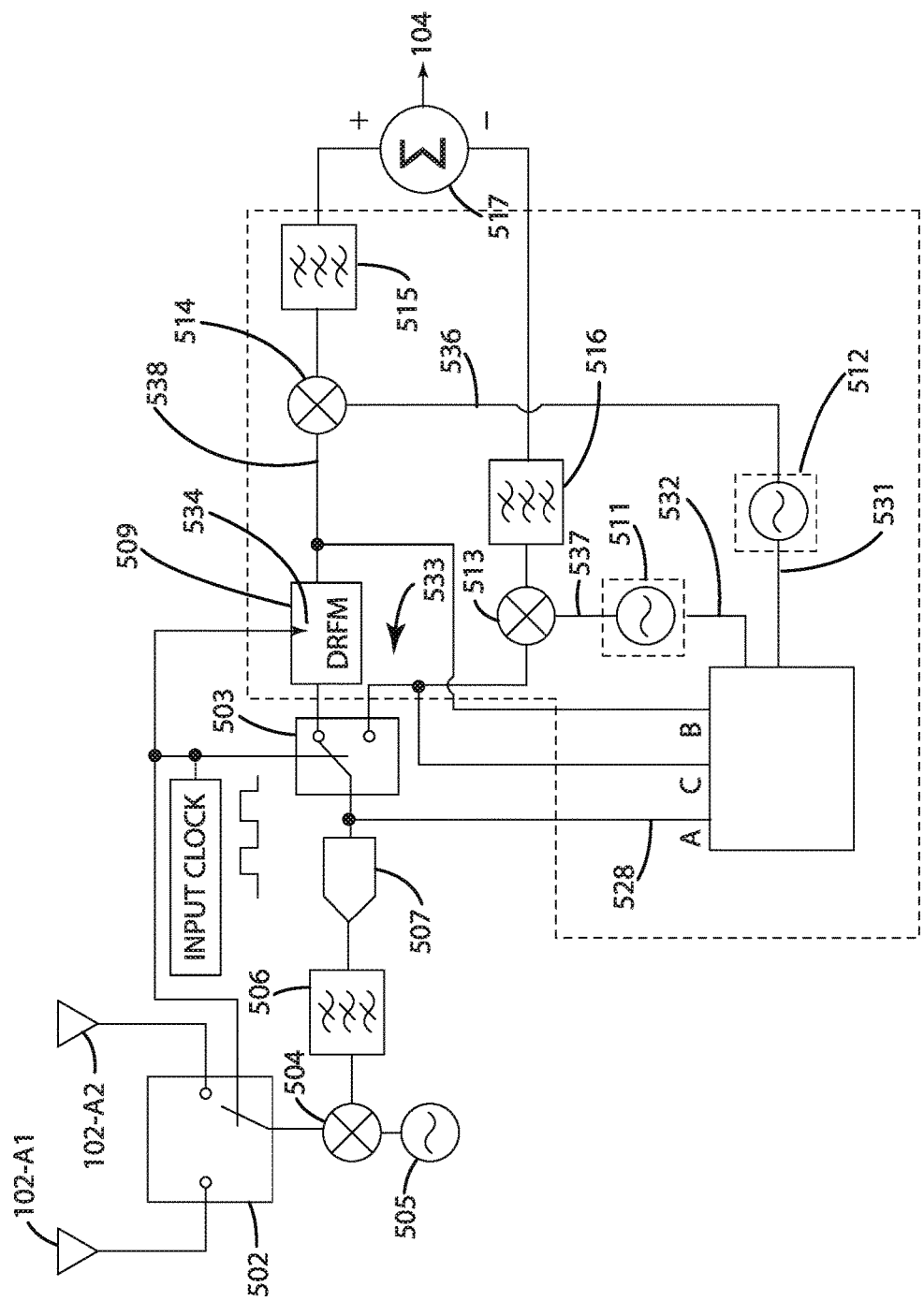
FIG. 10 depicts first and second antennas coupled to a phase detector in accordance with one embodiment.

Sampling of the RF signals output from the first and second antennas at different times may be conducted in accordance with the state of an RF switch, such as the RF switches 302, 502 described in conjunction with the illustrated embodiments of FIGS. 6, 8 and 10. The RF switch may be configured to pass through the RF signal from one of the plurality of antennas 102 depending on the state of the RF switch. In the illustrated embodiments of FIGS. 7D and 7E, the RF switch has two states, one in which the RF signal from the first antenna 102-A1 is passed, directly or indirectly, to a sampling circuit (e.g., an analog to digital converter), and the other in which the RF signal from the second antenna 102-A2 is passed, directly or indirectly, to the sampling circuit.

The switching rate of the RF switch may vary depending on the application. For instance, in the illustrated embodiment of FIG. 7D, the switching rate of the RF switch is greater than the bit rate of communications represented in the RF signal. For instance, the RF switch may be operated with a switching period of 30 ns or approximately 333 MHz whereas the bit rate of communications may be approximately 2 Mbps. Alternatively, the switching rate of the RF switch in one embodiment may be less than the bit rate of communications. An example of this mode of operation can be seen in the illustrated embodiment of FIG. 7E in which each sampling period spans one or more bits represented in the RF signal. As another example, both of the switching sections noted as A1 and A2 in FIG. 7E may span one sampling period for the second antenna 102-A2 and another sampling period for a similar portion of the dedicated portion 202 (e.g., the 000 portion of the sequence 1000) may be conducted for the RF signal output from the first antenna 102-A1.

In one embodiment, the bits or modulations represented in the RF signal output from each of the first and second antennas 102-A1, 102-A2 may be dynamically removed from the RF signal so that the phases of unmodulated forms of the RF signals from the first and second antennas 102-A1, 102-A2 may be compared. For instance, phase or frequency modulations in the RF signal from an antenna 102 may be dynamically detected and removed from the RF signal, leaving an unmodulated form of the RF signal that includes phase and frequency information of the RF signal but without the phase modulation due to transmission of a symbol.

A. First Embodiment for Phase Detector

A phase detector in accordance with one embodiment of the present disclosure is shown in FIG. 6 and generally designated 300. One or more aspects of the phase detector 300 may be incorporated into the phase detection component 70. In one embodiment, the phase detector 300 may be realized on a single chip. It is noted that the phase detector 300 and other embodiments of the phase detector may be incorporated as part of a receiver in the object component 50 for demodulating communications received in the electromagnetic waveform 201.

In the illustrated embodiment, the phase detector 300 may be coupled to an antenna array 30, which may include first and second antennas 102-A1, 102-A2 in accordance with one embodiment of the present disclosure. The phase detector 300 may be a receiver configured to measure the phase difference between RF signals output from the antennas 102-A1, 102-A2. Antennas 102-A1, 102-A2 may be connected to an RF switch 302, which is configured to pass through the RF signal output from one of the antennas 102-A1, 102-A2 based on the state of the RF switch 302. The output of the RF switch 302 and a local oscillator 305 may be connected to a frequency mixer 304.

The state of the RF switch 302 may be controlled as a function of the switch input 301, which may be provided by a component of the phase detector. The switch input 301 may be controlled so that the RF switch 302 repeats the sequence of providing an RF output from one of the antennas 102-A1 for a first duration of time and then providing an RF output from the other of the antennas 102-A2 for a second duration of time. The first and second durations of time may be the same, and may correspond to the time period of the electromagnetic waveform 201 (e.g., the reciprocal of the center frequency), or a multiple or fraction thereof (e.g., a harmonic). In one embodiment, the RF switch 302 may be selectively controlled so that the first and second antennas 102-A1, 102-A2 are commutated. The switching rate of the RF switch 302 may be determined based on the system configuration. The switch input 301 may be generated by an oscillator.

Although described in conjunction with switching between RF output signals of a pair of antennas 102-A1, 102-A2, the RF switch 302 may be configured to selectively output an RF output signal from more than two antennas 102 to an RF output of the RF switch 302. For instance, the RF switch 302 may commutate among eight antennas 102 disposed in a spaced apart relationship with respect to one another.

In one embodiment the state of the RF switch 302 may selectively change based on the communication protocol established with the source of the electromagnetic waveform 201, or based on communications received via the electromagnetic waveform 201, or a combination thereof. For instance, the RF switch 302 may be configured to output an RF output signal from the first antenna 102-A1 for a duration corresponding to a plurality of symbols (e.g., 4 symbols) represented in the electromagnetic waveform 201, and to output an RF output signal from the second antenna 102-A2 for a duration corresponding to the same number of symbols (e.g., 4 symbols) represented in the electromagnetic waveform 201. As another example, the RF switch 302 may be configured to switch between the first and second antennas 102-A1, 102-A2 at a rate substantially greater than the bit rate or symbol rate of communications represented in the electromagnetic waveform 201.

In one embodiment, the local oscillator 305 may generate a square wave signal having a frequency substantially the same as the carrier frequency or the center frequency of the electromagnetic waveform 201 received by the antennas 102-A1, 102-A2. For instance, the frequency of the square wave signal may be 2.402 MHz. Alternatively, the output from the local oscillator 305 may be a continuous sine wave. In one embodiment, the local oscillator 305 may be operated at a frequency different from the center frequency or carrier frequency of the electromagnetic waveform 201. For instance, the frequency of the local oscillator 305 may be higher or lower than the center frequency or carrier frequency of the electromagnetic waveform 201.

The frequency of the local oscillator 305 may be variable, enabling the phase detector 300 to operate in conjunction with electromagnetic waveforms 201 communicated at different channels or different frequency bands in which communications are transmitted at different center frequencies (e.g., a center frequency other than 2.402 MHz).

The RF output from the RF switch 302, which corresponds to the RF signals from the antennas 102-A1, 102-A2, may be mixed with the local oscillator 305 by the frequency mixer 304. The local oscillator 305 may be used in conjunction with the frequency mixer 304 to downconvert the waveform output signal or RF signal output from the antennas 102-A1, 102-A2 to an intermediate frequency (IF) signal with a frequency spectrum having lower frequency content than the center frequency or carrier frequency. As an example, with a local oscillator 305 operating at or substantially near the center frequency of the electromagnetic waveform 201, the RF signal from the antennas 102-A1, 102-A2 may be shifted to an IF signal with frequency content substantially centered about 0 Hz. An example of the frequency spectrum of such an IF signal generally centered about 0 Hz can be seen in FIG. 6, designated as 320. In another example, with the local oscillator 305 operating at a frequency higher than the center frequency of the electromagnetic waveform 201, the RF signal output from the antennas 102-A1, 102-A2 may be downconverted to an IF signal with a frequency spectrum centered generally about a frequency that is the difference between the center frequency and the frequency of the local oscillator 305. In this way, the DC component at 0 Hz can be removed from the signal while substantially preserving the spectral content of the RF signal (e.g., frequency and phase information). An example of the frequency spectrum of such an IF signal can be seen in FIG. 6, and generally designated 330.

With the local oscillator 305, the frequency mixer 304 and the RF signal from the antennas 102-A1, 102-A2, the RF signal may be shifted to an Intermediate Frequency (IF) which is a low or zero frequency. The IF signal can be isolated in the frequency domain by the filter 311. In one embodiment, the IF signal provided by the frequency mixer 304 may be a low frequency signal, in which case the filter 311 may be a band-pass filter (as shown in FIG. 6) to substantially isolate the IF signal in the frequency domain. Alternatively, the IF signal provided by the frequency mixer 304 may be an average of 0 Hz, in which case the signal is considered an analytic signal, having an in-phase and phase-quadrature signal. The filter 311 in this configuration may be a low-pass filter to substantially isolate the IF signal in the frequency domain.

The signal output from the filter 311 may be provided to phase comparison circuitry 313, which may include one or more of the following: an analog-to-digital (ADC) filter converter 312, a switch 303, first and second digital memories 307, 308 and a phase comparator 309. All or some components of the phase comparison circuitry 313 may be digital and may be configured in accordance with dedicated digital functions or processor-executed code, or a combination thereof.

The analog-to-digital (ADC) filter converter 312 may be configured to sample the signal output from the filter 311 and to preserve the spectral content thereof. The ADC filter converter 312 may be configured to output digitally encoded values representative of the samples obtained with respect to the signal output from the filter 311. The samples obtained by the ADC filter converter 312 may be digitally filtered (e.g., an IIR filter) in the process of generating the digitally encoded values. The digitally encoded values may be stored in memory or transferred to a hardware module or a software module, or a combination thereof, that stores the digitally encoded values in memory.

The digitally encoded values output from the ADC filter converter 312 may be provided to a switch 303, which may be implemented in hardware or software. The switch 303 may be operated in conjunction with the RF switch 302 based on the state of the switch input 301. For instance, if the state of the switch input 301 corresponds to a first antenna 102-A1, the output of the RF switch 302 may correspond to the RF signal of the first antenna 102-A1 and the output of the switch 303 may be associated with memory for the first antenna 102-A1. If the state of the switch input 301 corresponds to a second antenna 102-A2, the output of the RF switch 302 may correspond to the RF signal of the second antenna 102-A2 and the output of the switch 303 may be associated with memory for the first antenna 102-A2.

In one embodiment, the ADC filter converter 312 may be provided as a hardware module in an FPGA, and the digitally encoded values of the ADC filter converter 312 may be directed to different portions of hardware based on the state of the switch 303. Alternatively, the switch 303 may be implemented as part of a software module stored in memory of the phase detection component 70, and configured to receive the digitally encoded values of the ADC filter converter 312. The switch 303 in this example may be configured to direct the digitally encoded values to memory based on the state of the switch input 301.

As discussed herein, in one embodiment, the RF switch 302 and the switch 303 may be controlled in tandem by the switch input 301. The switch 303 may provide the IF signal, generated and filtered by the frequency mixer 304 and the filter 311, to one of first and second digital memories 307, 308. For instance, during the first half of the dedicated portion 202 depicted in the illustrated embodiments of FIGS. 2 and 7A, the first digital memory 307 may be coupled to store the digitally encoded values corresponding to the IF signal. During the second half of the dedicated portion 202, the second digital memory 308 may be coupled to store digitally encoded values corresponding to the IF signal. In the illustrated embodiment, because the switch 303 is operated in tandem with the RF switch 302, 1) the IF signal during the first half of the dedicated portion 202 and stored in the first digital memory 307 corresponds to the RF signal output from the first antenna 102-A1, and 2) the IF signal during the second half of the dedicated portion 202 and stored in the second digital memory 308 corresponds to the RF signal output from the second antenna 102-A2.

In one embodiment, after the dedicated portion 202 has elapsed, the digital memories 307, 308 may be configured to replay or output their respective signals by providing them to the phase comparator 309. The phase comparator 309 may be configured to generate a phase difference between the first and second antennas 102-A1, 102-A2 based on the values stored in the digital memories 307, 308. The output from the phase comparator 309 may correspond to the phase difference signal 104 of the phase detection component 70, which is configured according to one embodiment of the phase detector 300.

B. Second Embodiment for Phase Detector

A phase detector in accordance with one embodiment of the present disclosure is shown in FIG. 8 and generally designated 350. One or more aspects of the phase detector 350 may be incorporated into the phase detection component 70. In one embodiment, the phase detector 350 may be realized on a single chip. As discussed herein, the phase detector 350 may include a secondary receiver configured to generate a secondary waveform output signal or a secondary RF signal that corresponds to the electromagnetic waveform 201 received by an antenna 102. The secondary RF signal may be demodulated to determine the symbols or bits represented in the electromagnetic waveform 201. These symbols or bits may be communicated to a primary receiver to facilitate removal of the symbols or bits from an RF signal, thereby facilitating a comparison of phase with respect to the electromagnetic waveform 201 received by the primary receiver. The secondary receiver may share one or more antennas 102 of the primary receiver. Alternatively, the secondary receiver may be coupled to an antenna 102 separate from those coupled to the primary receiver, and may communicate the bits determined from the RF signal to the primary receiver via a separate communications link (e.g., via a wireless link separate from the communications represented in the electromagnetic waveform 201).

The phase detector 350 in the illustrated embodiment is similar to the phase detector 300 in the illustrated embodiment of FIG. 6 but with several exceptions. For instance, the phase detector 350 may include one or more of the following components of the phase detector 300: an RF switch 302, a frequency mixer 304, a filter 311, an ADC 312, a switch 303 and first and second memories 307, 308. The phase detector 350 may also include a phase comparator 309 configured to output a phase difference signal 104 based on a phase comparison of two input signals.

The phase detector 350 in the illustrated embodiment includes primary receiver circuitry 352 and a secondary receiver 354 coupled to the first antenna 102-A1. The secondary receiver 354 may be coupled to a different antenna 102, as discussed herein. For instance, the secondary receiver 354 may be coupled to an antenna 102 that does not provide an RF signal to the primary receiver circuitry 352. More specifically, the secondary receiver 354 and an antenna 102 coupled to the secondary receiver 354 may be disposed in a separate device (e.g., the primary receiver circuitry 352 may be in one sensor 40 and the secondary receiver 354 may be in another sensor 40).

The secondary receiver 354 may be configured to demodulate the RF signal obtained from the first antenna 102-A1 to generate a stream of modulation information (e.g., a bit stream) representative of the modulations in the RF signal. This modulation information may be communicated to the primary receiver circuitry 352. Communicating the modulation information may be achieved via direct electrical connections (e.g., a serial, wired interface) or via wireless communications. In one embodiment, the modulation information may be communicated from the secondary receiver 354 to the primary receiver circuitry 352 via a wireless communication link that is separate from the communication link utilized for receipt of the modulation information. The separate communication link may be established according to the same communication protocol as the communication link used for receipt of the modulation information. For instance, both communication links for receipt of the modulation information from the electromagnetic waveform 201 and transmission of the modulation information from the secondary receiver 354 to the primary receiver circuitry 352 may be established via Wi-Fi.

Based on receipt of the modulation information from the secondary receiver 354, the primary receiver circuitry 352 may demodulate the RF signals obtained from the first and second antennas 102-A1, 102-A2. The demodulated RF signals may be stored respectively in the first and second memories 307, 308 and provided to the phase comparator 309.

Demodulation of the RF signals from the first and second antennas 102-A1, 102-A2 may be performed by demodulation circuitry 356 of the primary receiver circuitry 352. The demodulation circuitry 356 may be configured to demodulate the RF signals based on the modulation information obtained from the secondary receiver 354. Demodulation may be conducted in a variety of ways, including via mixing with in-phase and quadrature phase signals.

C. Third Embodiment for Phase Detector

Figure 9:
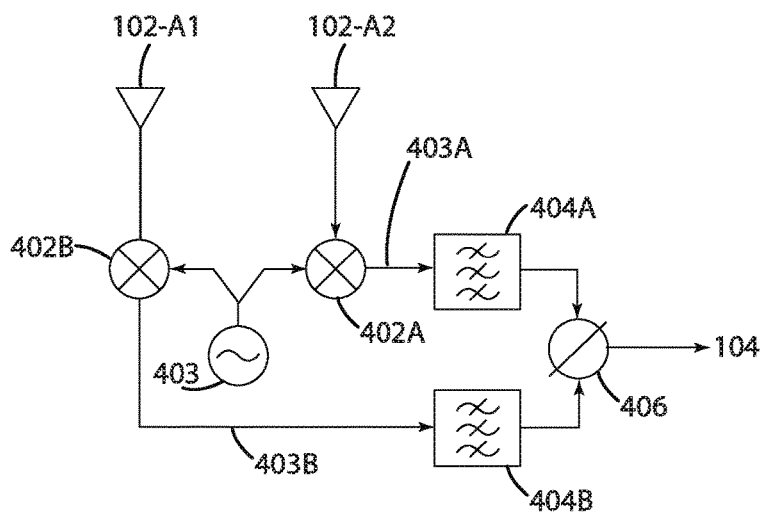
FIG. 9 depicts first and second antennas coupled to a phase detector in accordance with one embodiment.

A phase detector in accordance with one embodiment of the present disclosure is shown in FIG. 9 and generally designated 400. One or more aspects of the phase detector 400 may be incorporated into the phase detection component 70. In one embodiment, the phase detector 400 may be realized on a single chip.

In the illustrated embodiment, the phase detector 400 may be configured to measure the phase difference between RF signals output from the first and second antennas 102-A1, 102-A2. The first and second antennas 102-A1, 102-A2 and a local oscillator 403 may be connected respectively to first and second frequency mixers 402A, 402B. The first and second frequency mixers 402A, 402B may form part of first and second receivers for receiving communications from the first and second antennas 102-A1, 102-A2.

In the illustrated embodiment, the first and second frequency mixers 402A, 402B may be configured to shift the RF signal output from the first and second antennas 102-A1, 102-A2, respectively, to first and second IF signals 403A, 403B. The IF signals 403A, 403B may be low or zero frequency, which can be isolated in the frequency domain respectively by first and second filters 404A, 404B. The IF signals 403A, 403B provided by the first and second mixers 402A, 402B may be a low frequency signal, in which case the first and second filters 404A, 404B may be a band-pass filter (as depicted). Alternatively, the IF signals 403A, 403B may be an average of 0 Hz, in which case the IF signals 403A, 403B may be considered analytic signals, having an in-phase and phase-quadrature signal.

The output from the first and second filters 404A, 404B may be provided to a phase comparator 406, which in turn provides the phase difference signal 104 that represents the phase difference between the RF signals output from the first and second antennas 102-A1, 102-A2.

D. Fourth Embodiment for Phase Detector

Figure 11:
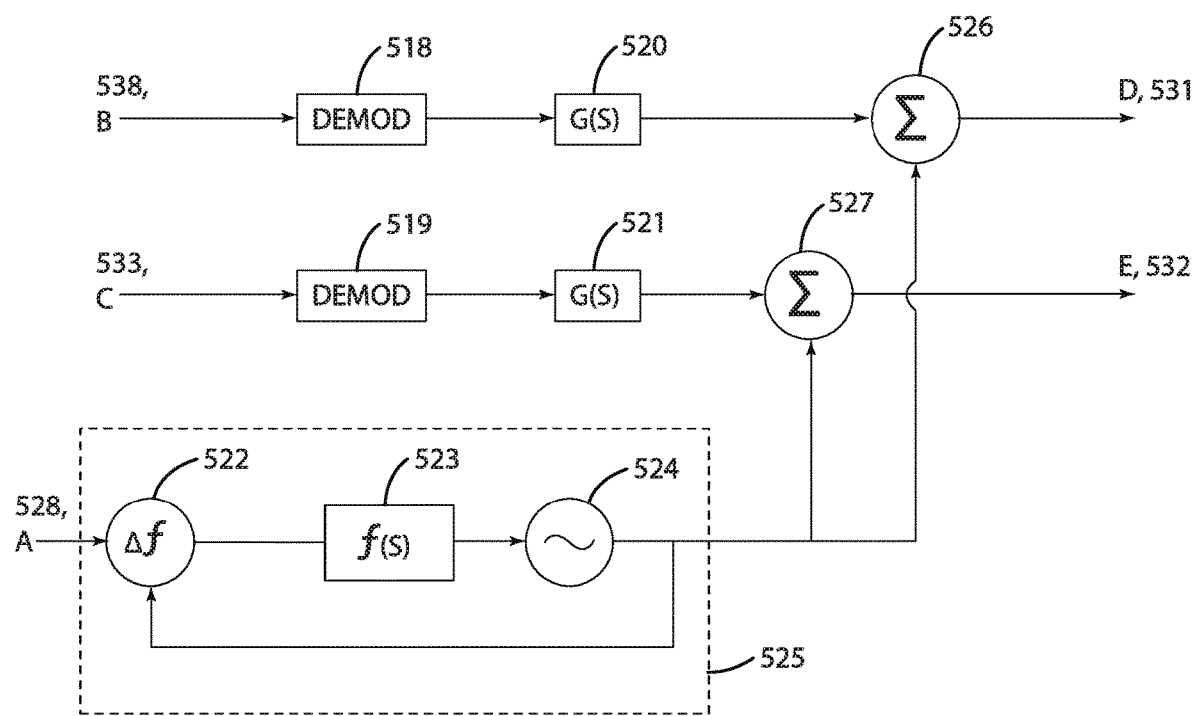
FIG. 11 shows a MODEM in accordance with one embodiment.
Figure 12:
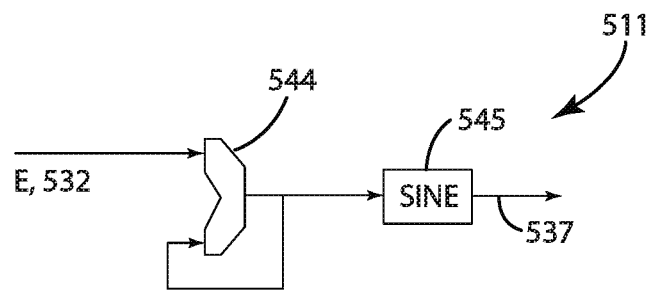
FIG. 12 shows a digitally controlled oscillator in accordance with one embodiment.

A phase detector in accordance with one embodiment of the present disclosure is shown in FIGS. 10-12 and generally designated 500. One or more aspects of the phase detector 500 may be incorporated into the phase detection component 70. In one embodiment, the phase detector 500 may be realized on a single chip. It is noted that several components of the phase detector 500 are described as "blocks" for purposes of discussion—a block may be implemented in software or hardware, or both. One aspects of the block may be implemented in software and another aspect of the block may be implemented in hardware.

In one embodiment, the phase detector 500 is configured to detect a phase difference between RF signals output from first and second antennas 102-A1, 102-A2 irrespective of any modulations in the RF signals. Any length of data obtained in the RF signals may be analyzed to determine the phase difference. As an example, the phase difference may be determined without use of a dedicated portion 202 incorporated into the message packet 600. In other words, the phase difference may be determined with respect to portions of the RF signals output from the first and second antennas 102-A1, 102-A2 regardless of whether any modulations are included in the RF signals during those portions.

In the illustrated embodiment of FIG. 10, the phase detector 500 includes several components similar to those described in conjunction with the phase detector 300. For instance, the phase detector 500 includes: a switch input 501, an RF switch 502, a frequency mixer 504, a filter 506, an ADC 507, and a switch 503 similar respectively to the switch input 301, the RF switch 302, the frequency mixer 304, the filter 311, the ADC 312, and the switch 303 of the phase detector 300. For instance, the switch input 501, similar to the switch input 301 may correspond to an output of an oscillator as show in the illustrated embodiment of FIG. 10.

The phase detector 500 is different from the phase detector 300 in some respects. For instance, in contrast to one embodiment of the phase detector 300, one embodiment of the phase detector 500 may be configured to determine a phase difference with respect to a pair of RF signals from the first and second antennas 102-A1, 102-A2 regardless of any modulations in the RF signals or without the need to use a dedicated portion 202 in the message packet 600, or both.

The phase detector 500 may determine a phase difference of the RF signals for periods of time substantially longer than a dedicated portion 202. In one embodiment, the phase difference may be determined for a period longer than the message packet 600 or longer than a field of the message packet 600. In one embodiment, the phase difference may be determined continuously with respect to the RF signals output from the first and second antennas 102-A1, 102-A2 regardless of any modulations in the RF signals.

In the illustrated embodiment of FIG. 10, the phase detector 500 includes demodulation circuitry 556 configured to demodulate the RF signals output from the first and second antennas 102-A1, 102-A2. The demodulation circuitry 556 may sample portions of the RF signals at different times, and demodulate the sampled portions to yield an unmodulated form of the sampled portions. The unmodulated forms of the sampled portions may facilitate determining a phase difference between the sampled portions of the RF signals irrespective of any modulations in the sampled portions.

The phase detector 500 of the illustrated embodiment may be configured to operate as a receiver that measures the phase difference between RF signals received by the first and second antennas 102-A1, 102-A2. The first and second antennas 102-A1, 102-A2 may receive the electromagnetic waveform 201 and provide an RF signal, also described herein as an output waveform signal, representative of the electromagnetic waveform 201.

The RF signals provided by the first and second antennas 102-A1, 102-A2 may be selected by the RF switch 503 and applied to the mixer 504 along with the signal from the local oscillator 505. In accordance with one or more embodiments described herein, the mixer 504 may shift the RF signal to an Intermediate Frequency (IF) signal, which may be a low or zero average frequency. The IF signal may be substantially isolated in the frequency domain by the filter 506. As discussed herein, in instances where the IF signal is a low frequency signal, the filter 506 may be configured as a band-pass filter. In instances where the IF signal has an average of approximately 0 Hz, the IF signal may be considered an analytic signal, having an in-phase and phase-quadrature signal. In the illustrated embodiment, the output from the filter 506 may be digitized by the ADC 507. Optionally, the filter 506 may be provided after the ADC and filtering may be conducted with respect to the digitized form of the IF signal.

The digitally encoded values output from the ADC 507, which represent samples of the IF signal, may be stored in memory or transferred to a hardware module or software module that stores the digitally encoded values in memory or performs an operation on the digitally encoded values, or a combination thereof.

In the illustrated embodiment, the digitally encoded values may be provided to the switch 508, which provides the digitally encoded values to either the Digital RF Memory (DRFM) 509 or the direct connection signal (or output) 533 depending on the state of the switch input 501. As an example, when the switch input 501 is high, the RF signal from the second antenna 102-A2 may be provided from the RF switch 502 and saved in the DRFM 509, and when the switch input 501 is low, the RF signal from the first antenna 102-A1 may be provided from the RF switch 502 to the direct connection signal 533.

The DRFM 509 may be set to record or play-back according to the state 535 as applied to the control port 534. For instance, using the example in the preceding paragraph, when the switch input 501 is low, the stored RF signal from the second antenna 102-A2 may be replayed to the DRFM output 538.

The control state or the state of the switch input 501 may commutate with approximately 50% duty cycle at a rate substantially slower than the data rate of the incoming RF signal. The duration of each cycle at the rate is, for example, at least 10 times as long as each symbol received at the first and second antennas 102-A1, 102-A2. The switch input 501 may control the RF switch 502, the switch 503 as well as the DRFM 509 in tandem. The DRFM 509 may record the applied signal when the switch 508 applies the signal to the DRFM 509. When the control state applies the switch 503 output to direct connection signal 533, the DRFM 509 may be in the playback mode.

In the illustrated embodiment, the DRFM output 538 and the direct connection signal 533 are connected to frequency mixers 513 and 514. The second DCO output 536, based on output from a MODULATOR/DEMODULATOR (MODEM) 510, has substantially the same frequency modulation and frequency to the corresponding DRFM output 538. And, the DCO output 537, based on output from the MODEM 510, may have substantially the same frequency modulation and frequency to the corresponding direct connection signal 533. As a result, first and second mixers 513 and 514, configured to respectively receive these signals, may produce signals without modulation and whose DC amplitude is proportional to the phase difference of the applied signals. In this way, supplying the second DCO output 536 and the DRFM output 538 to the second frequency mixer 514 may generate an unmodulated form of the RF signal output from one of the antennas 102-A1, 102-A2. And supplying the first DCO output 537 and the direct connection signal 533 to the first mixer may generate an unmodulated form of the RF signal output from the other of the antennas 102-A1, 102-A2.

The output of the first and second mixers 513, 514 may be low-pass filtered by first and second filters 515, 516 and then provided to the difference block 517. The difference block 517 may be configured to output a DC signal representative of the phase difference of the signal at the first and second antennas 102-A1, 102-A2—i.e., the difference block 517 may be configured to output the phase difference signal (or output) 104 in accordance with one embodiment of the present disclosure.

The DCO signals 536 and 537 may be generated by applying first and second frequency control signals 531, 532 to digitally controlled oscillators (DCOs) 511, 512. The MODEM 510 may receive the unswitched input signal 528, the DRFM output signal 538, and the direct connection signal 533, and may be configured to generate first and second modulation/control signals 531, 532 for the first and second DCOs 511, 512. Although the direct connection signal 533 is described generally herein as being a direct connection with no memory, the present disclosure is not so limited. The direct connection signal 533 may alternatively be based on the switch output signal coupled to the direct connection signal 533 and processed through a software module or a hardware module, or both, before being provided to the first frequency mixer 513 and the MODEM 510. Additionally, or alternatively, the DRFM output 538 may be replaced or supplemented with a software module or a hardware module, or both, to generate the signal 538 provided to the second frequency mixer 514 and the MODEM 510.

The MODEM 510 in FIG. 10 is shown in additional detail in accordance with one embodiment in FIG. 11. The MODEM 510, as discussed herein, may generate first and second modulation/control signals 531, 532 based on the unswitched input signal 528, the DRFM output signal 538, and the direct connection signal 533. The unswitched input signal 528 may be applied to a Frequency-Locked-Loop (FLL) 525 including a frequency detector 522, a loop filter 523, and a DCO 524. The DCO 524 may be configured to track the average frequency of the unswitched input signal 528 with a time constant as set by the loop filter 523 that is long relative to the switching rate of the switch input 501 (e.g., the control state).

The DRFM output signal 538 and direct connection signal 533 may be applied to first and second demodulators 518, 519, which may be configured to supply binary data respectively to first and second modulation filters 520, 521. In the illustrated embodiment, the first and second modulation filters 520, 521 may filter the signal, received respectively from the first and second demodulators 518, 519, with the same or similar filtering used in the modulation process applied to signals received at antennas 102-A1, 102-A2. The signals at the output of the first and second modulation filters 520, 521 may be summed in blocks 526 and 527 with the DCO frequency control signal 530, thereby yielding the first and second control signals 531, 532.

Figure 13:
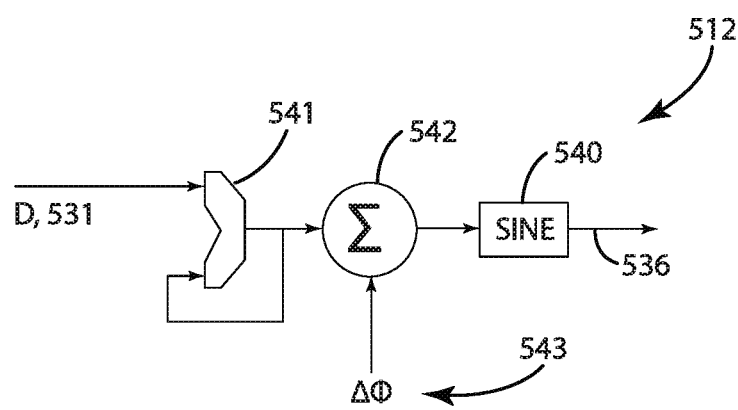
FIG. 13 shows a digitally controlled oscillator in accordance with one embodiment.

FIGS. 12 and 13 depict the first and second DCOs 511, 512 in further detail in accordance with one embodiment of the present disclosure. The DCOs may be synchronous devices whose blocks change state on every clock cycle. In the illustrated embodiment of FIG. 12, the first DCO 511 includes an add-accumulate block 544 whose output represents phase. The output of add-accumulate block 544 may be added to itself plus, on every clock cycle, a phase increment signal, which is the first modulation signal 532 output from the MODEM 510. The phase increment signal may represent frequency. The phase output from the add-accumulate block 544 may be applied to a sine-look-up table 545, which in turn may generate a digital sine wave 537 corresponding to the phase output of the add-accumulate block 544.

In the illustrated embodiment of FIG. 13, the second DCO 512 may be configured similar to the first DCO 511, but with the exception of using a phase offset 543. The second DCO 512 in the illustrated embodiment may be an add-accumulate block 541 whose output represents a first phase. The output of the add-accumulate block 541 may be added to itself plus, on every clock cycle, a phase increment signal, which is the second modulation signal 531 from the MODEM in the illustrated embodiment. The phase increment signal may represent frequency. The first phase output from the add-accumulate block 541 may be added to the phase offset 543 in an adder block 542 to yield a second phase output. The phase output from add-accumulate is applied to sine-look-up table 540 which in turn supplies a digital sine wave 536. The second phase output may be applied to a sine-look-up table 540, which may generate a digital sine wave 536 corresponding to the second phase output of the adder block 542.

In one embodiment, the FLL 525 may react slowly to changes in frequency and even more slowly to changes in phase. As a result, the FLL 525 may not substantially change phase due to the difference in phase of RF signals output from the first and second antennas 102-A1, 102-A2 when the RF switch 502 is commutated. When multiplying the DRFM output signal 538 (or the direct connection signal 533) by a signal with the same average frequency plus frequency modulation as the DRM output signal 538 (or the direct connection signal 533) the process may strip off the modulation from the signal and leave a DC signal proportional to the phase difference. The phase offset 543 in DCO 512 may be applied to compensate for the time delay between sampling the signals at the first and second antennas 102-A1, 102-A2. As such, there may be a first phase difference between the second DCO output 536 and the DRFM output 538 and a second phase difference between the direct connection signal 533 and the first DCO output 537. These first and second phase differences in one embodiment can be readily measured after low pass filtering in filters 515 and 516. Further, the difference between the first and second phase difference may arise due to the phase shift at the first and second antennas 102-A1, 102-A2 so that the final output from the difference block 517 represents this phase shift.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. Any reference to claim elements as "at least one of X, Y and Z" is meant to include any one of X, Y or Z individually, and any combination of X, Y and Z, for example, X, Y, Z; X, Y; X, Z; and Y, Z.

The invention claimed is:

1. A system for determining an angle of arrival for frequency modulated communications, said system comprising:
   a first antenna capable of wirelessly receiving the frequency modulated communications to generate a first frequency modulated output;
   a second antenna separated by a distance from the first antenna, the second antenna capable of wirelessly receiving the frequency modulated communications to generate a second frequency modulated output, wherein the first frequency modulated output and the second frequency modulated output are indicative of the frequency modulated communications arriving at the first and second antennas at different times;
   a controller configured to determine a phase difference between the first and second frequency modulated outputs received by the first and second antennas, wherein the phase difference is determined based on unmodulated forms determined from the first and second frequency modulated outputs, whereby the phase difference is determined irrespective of frequency modulations in the first and second frequency modulated outputs;
a first receiver is coupled to the first antenna to generate the first frequency modulated output;
a second receiver is coupled to the second antenna to generate the second frequency modulated output;
the first and second frequency modulated outputs are generated simultaneously by the first and second receivers;
the phase difference is determined based on the first and second frequency modulated outputs;
the first receiver includes a first frequency mixer and the second receiver includes a second frequency mixer;
the first frequency mixer and the second frequency mixer are coupled to an oscillation output from a common oscillator;
the first frequency mixer generates a first intermediate frequency signal based on the first frequency modulated output from the first antenna and the oscillation output;
the second frequency mixer generates a second intermediate frequency signal based on the second frequency modulated output from the second antenna and the oscillation output; and
the phase difference is determined based on the first and second intermediate frequency signals.

2. The system of claim 1 wherein the angle of arrival for the frequency modulated communications is determined based on the phase difference.

3. The system of claim 1 wherein the first and second receivers are phase locked.

4. The system of claim 1 wherein:
the first and second antennas are operably coupled to a receiver;
the receiver generates a first received signal corresponding to the first frequency modulated output for a first duration, the first received signal being indicative of frequency modulations in the frequency modulated communications; and
the receiver generates a second received signal corresponding to the second frequency modulated output for a second duration, the second received signal being indicative of the frequency modulations in the frequency modulated communications, the first duration being different from the second duration.

5. The system of claim 4 comprising demodulation circuitry configured to generate a first unmodulated signal based on the first received signal and a second unmodulated signal based on the second received signal, wherein the first unmodulated signal corresponds to the first duration and the second unmodulated signal corresponds to the second duration.

6. The system of claim 5 wherein a first phase of the first unmodulated signal is compared to a second phase of the second unmodulated signal, and wherein the phase difference is based on a comparison between the first phase and the second phase with respect to unmodulated signals obtained at different times and generated from the frequency modulated communications.

7. A system for determining an angle of arrival for frequency modulated communications, said system comprising:
a first antenna capable of wirelessly receiving the frequency modulated communications to generate a first frequency modulated output;
a second antenna separated by a distance from the first antenna, the second antenna capable of wirelessly receiving the frequency modulated communications to generate a second frequency modulated output, wherein the first frequency modulated output and the second frequency modulated output are indicative of the frequency modulated communications arriving at the first and second antennas at different times;
a controller configured to determine a phase difference between the first and second frequency modulated outputs received by the first and second antennas, wherein the phase difference is determined based on unmodulated forms determined from the first and second frequency modulated outputs, whereby the phase difference is determined irrespective of frequency modulations in the first and second frequency modulated outputs;
wherein the first and second antennas are operably coupled to a receiver;
wherein the receiver generates a first received signal corresponding to the first frequency modulated output for a first duration, the first received signal being indicative of frequency modulations in the frequency modulated communications;
wherein the receiver generates a second received signal corresponding to the second frequency modulated output for a second duration, the second received signal being indicative of the frequency modulations in the frequency modulated communications, the first duration being different from the second duration;
demodulation circuitry configured to generate a first unmodulated signal based on the first received signal and a second unmodulated signal based on the second received signal, wherein the first unmodulated signal corresponds to the first duration and the second unmodulated signal corresponds to the second duration;
wherein a first phase of the first unmodulated signal is compared to a second phase of the second unmodulated signal, and wherein the phase difference is based on a comparison between the first phase and the second phase with respect to unmodulated signals obtained at different times and generated from the frequency modulated communications; and
wherein the demodulation circuitry is configured to decode the first received signal to generate a first modulation signal and to decode the second received signal to generate a second modulation signal, wherein the first unmodulated signal is an intermediate frequency signal based on the first modulation signal, and wherein the second unmodulated signal is an intermediate frequency signal based on the second modulation signal.

8. A method of determining an angle of arrival for frequency modulated communications, said method comprising:
generating a first frequency modulated output based on wireless receipt of the frequency modulated communications in a first antenna;
generating a second frequency modulated output based on wireless receipt of the frequency modulated communications in a second antenna, wherein the second antenna is separated by a distance from the first antenna;
producing first and second unmodulated forms of the first and second frequency modulated outputs;

determining a phase difference based on the first and second unmodulated forms such that the phase difference is determined irrespective of frequency modulations in the first and second frequency modulated outputs;

providing an oscillation signal at an oscillation frequency;

mixing the first frequency modulated output and the oscillation signal to generate a first intermediate frequency signal;

mixing the second frequency modulated output and the oscillation signal to generate a second intermediate frequency signal; and determining the phase difference based on the first and second intermediate frequency signals, whereby the phase difference is based on the first and second frequency modulated outputs via the first and second intermediate frequency signals.

9. The method of claim 8 comprising determining the angle of arrival based on the phase difference.

10. The method of claim 8 comprising simultaneously generating the first frequency modulated output in a first receiver coupled to the first antenna and the second frequency modulated output from a second receiver coupled to the second antenna.

11. The method of claim 8 comprising:

generating, in a receiver, a first received signal corresponding to the first frequency modulated output for a first duration, wherein the first received signal is indicative of frequency modulations in the frequency modulated communications; and generating, in the receiver, a second received signal corresponding to the second frequency modulated output for a second duration, wherein the second received signal is indicative of frequency modulations in the frequency modulated communications, wherein the first duration is different from the second duration.

12. The method of claim 11 comprising:

determining a first unmodulated signal segment based on the first received signal;

determining a second unmodulated signal segment based on the second received signal; and determining the phase difference based on a comparison of a first phase of the first unmodulated signal segment and a second phase of the second unmodulated signal segment, wherein the first unmodulated signal segment and the second unmodulated signal segment correspond to different durations of the frequency modulated communications.

13. A system for determining an angle of arrival for a wireless communication signal, said system comprising:

a first antenna capable of wirelessly receiving a first arbitrary length of the wireless communication signal to facilitate generation of a first frequency modulated segment;

a second antenna separated by a distance from the first antenna, the second antenna capable of wirelessly receiving a second arbitrary length of the wireless communication signal to facilitate generation of a second frequency modulated segment, wherein the first frequency modulated segment and the second frequency modulated segment arrive at the first and second antennas at different times, wherein the first and second frequency modulated segments include frequency modulations representative of data;

a controller configured to determine a phase difference between the first and second frequency modulated segments received by the first and second antennas, wherein the phase difference is determined based on unmodulated forms of the first and second frequency modulated segments and irrespective of the frequency modulations representative of data;

a first receiver is coupled to the first antenna to generate the first frequency modulated segment;

a second receiver is coupled to the second antenna to generate the second frequency modulated segment;

the first receiver includes a first frequency mixer and the second receiver includes a second frequency mixer;

the first frequency mixer and the second frequency mixer are coupled to an oscillation output from a common oscillator;

the first frequency mixer generates a first intermediate frequency signal based on a first frequency modulated output from the first antenna and the oscillation output;

the second frequency mixer generates a second intermediate frequency signal based on a second frequency modulated output from the second antenna and the oscillation output; and the phase difference is determined based on the first and second intermediate frequency signals.

14. The system of claim 13 wherein the angle of arrival for the wireless communication signal is determined based on the phase difference.

15. The system of claim 13 comprising:

a first receiver is coupled to the first antenna to generate the first frequency modulated segment;

a second receiver is coupled to the second antenna to generate the second frequency modulated segment; and wherein the first and second receivers are phase-locked to facilitate determining the phase difference of the first and second frequency modulated segments.

16. The system of claim 13 comprising a receiver operably coupled to the first and second antennas, wherein the receiver is commutated to generate the first frequency modulated segment and the second frequency modulated segment at different time durations.

17. The system of claim 16 wherein a first unmodulated signal segment is generated based on the first frequency modulated segment, wherein a second unmodulated signal segment is generated based on the second frequency modulated segment, and wherein the phase difference is determined based on a phase comparison between the first and second unmodulated signal segments.

* * * * *